US011840648B2

(12) United States Patent
Miyazawa et al.

(10) Patent No.: US 11,840,648 B2
(45) Date of Patent: Dec. 12, 2023

(54) SEMICONDUCTOR DEVICE MANUFACTURING METHOD, CURABLE RESIN COMPOSITION FOR TEMPORARY FIXATION MATERIAL, FILM FOR TEMPORARY FIXATION MATERIAL, AND LAMINATED FILM FOR TEMPORARY FIXATION MATERIAL

(71) Applicant: HITACHI CHEMICAL COMPANY, LTD., Tokyo (JP)

(72) Inventors: Emi Miyazawa, Tokyo (JP); Tsuyoshi Hayasaka, Tokyo (JP); Takashi Kawamori, Tokyo (JP); Shinichiro Sukata, Tokyo (JP); Yoshihito Inaba, Tokyo (JP); Keisuke Nishido, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 556 days.

(21) Appl. No.: 16/767,908

(22) PCT Filed: Nov. 29, 2018

(86) PCT No.: PCT/JP2018/044057
§ 371 (c)(1),
(2) Date: May 28, 2020

(87) PCT Pub. No.: WO2019/107508
PCT Pub. Date: Jun. 6, 2019

(65) Prior Publication Data
US 2020/0399506 A1    Dec. 24, 2020

(30) Foreign Application Priority Data
Dec. 1, 2017 (WO) .................. PCT/JP2017/043363

(51) Int. Cl.
*C09J 4/06* (2006.01)
*C09J 7/30* (2018.01)
(Continued)

(52) U.S. Cl.
CPC .................. *C09J 4/06* (2013.01); *B32B 7/12* (2013.01); *B32B 17/06* (2013.01); *B32B 37/12* (2013.01);
(Continued)

(58) Field of Classification Search
CPC ............ C09J 2203/326; C09J 2301/502; C09J 201/00; C09J 4/00; C09J 7/00;
(Continued)

(56) References Cited

U.S. PATENT DOCUMENTS 8,034,659 B2 * 10/2011 Nagai ............... H01L 21/67092
438/118
8,969,177 B2 * 3/2015 Chowdhury ...... H01L 21/67207
438/464

(Continued)

FOREIGN PATENT DOCUMENTS

| CN | 1886831 | 12/2006 |
|---|---|---|
| JP | 63-145077 | 6/1988 |

(Continued)

OTHER PUBLICATIONS

International Search Report dated Feb. 12, 2019 in corresponding International (PCT) Application No. PCT/JP2018/044057.
(Continued)

*Primary Examiner* — Jaehwan Oh
(74) *Attorney, Agent, or Firm* — Wenderoth Lind & Ponack, L.L.P.

(57) ABSTRACT

Disclosed is a semiconductor device manufacturing method, including a preparation step of preparing a laminated body in which a supporting member, a temporary fixation material layer that generates heat upon absorbing light, and a semi-
(Continued)

conductor member are laminated in this order, and a separation step of irradiating the temporary fixation material layer in the laminated body with incoherent light and thereby separating the semiconductor member from the supporting member.

11 Claims, 8 Drawing Sheets

(51) Int. Cl.
    | | | |
    |---|---|---|
    | B32B 7/12 | (2006.01) | |
    | B32B 17/06 | (2006.01) | |
    | B32B 37/12 | (2006.01) | |
    | B32B 43/00 | (2006.01) | |
    | C09J 9/02 | (2006.01) | |
    | C09J 11/04 | (2006.01) | |
    | H01L 21/683 | (2006.01) | |

(52) U.S. Cl.
    CPC .............. *B32B 43/006* (2013.01); *C09J 7/30* (2018.01); *C09J 9/02* (2013.01); *C09J 11/04* (2013.01); *H01L 21/6835* (2013.01); *B32B 2037/1253* (2013.01); *B32B 2310/0825* (2013.01); *C09J 2203/326* (2013.01); *C09J 2203/37* (2020.08); *C09J 2409/00* (2013.01); *C09J 2433/00* (2013.01); *H01L 2221/68381* (2013.01)

(58) Field of Classification Search
    CPC ............ C09J 2301/416; H01L 21/6836; H01L 21/30; H01L 21/6835
    See application file for complete search history.

(56) References Cited

U.S. PATENT DOCUMENTS

| | | | | |
|---|---|---|---|---|
| 9,543,197 | B2* | 1/2017 | Hu | H01L 24/24 |
| 10,128,143 | B2* | 11/2018 | Tanabe | H01L 21/6836 |
| 2007/0077685 | A1* | 4/2007 | Noda | H01L 21/67132 |
| | | | | 438/107 |
| 2008/0128694 | A1* | 6/2008 | Arita | H01L 22/34 |
| | | | | 257/E21.599 |
| 2009/0203285 | A1* | 8/2009 | Kobayashi | H10K 59/35 |
| | | | | 445/58 |
| 2010/0003771 | A1* | 1/2010 | Nagai | H01L 24/83 |
| | | | | 523/400 |
| 2010/0092718 | A1* | 4/2010 | Shin | H01L 21/67005 |
| | | | | 156/60 |
| 2010/0144097 | A1* | 6/2010 | Koroku | H01L 21/561 |
| | | | | 257/E21.508 |
| 2010/0266373 | A1* | 10/2010 | George | B32B 43/006 |
| | | | | 414/225.01 |
| 2012/0064669 | A1* | 3/2012 | Higuchi | H01L 21/78 |
| | | | | 438/114 |
| 2013/0220687 | A1* | 8/2013 | Tagami | C09J 7/30 |
| | | | | 438/464 |
| 2013/0244400 | A1* | 9/2013 | George | H01L 21/67092 |
| | | | | 438/455 |
| 2014/0154868 | A1* | 6/2014 | Sugo | H01L 21/78 |
| | | | | 428/41.4 |
| 2015/0184032 | A1* | 7/2015 | Iwai | H01L 21/30625 |
| | | | | 524/502 |
| 2016/0064265 | A1* | 3/2016 | Nakamura | H01L 21/76898 |
| | | | | 156/247 |
| 2016/0093522 | A1* | 3/2016 | Tagami | B32B 7/06 |
| | | | | 428/336 |
| 2016/0189996 | A1* | 6/2016 | Tanabe | H01L 21/6835 |
| | | | | 438/692 |
| 2017/0194540 | A1* | 7/2017 | Liu | H01L 25/0753 |
| 2018/0151804 | A1* | 5/2018 | Chaji | H10K 71/00 |
| 2019/0348573 | A1* | 11/2019 | Raymond | H01L 25/0753 |
| 2020/0251431 | A1* | 8/2020 | Priewasser | H01L 24/04 |
| 2022/0028722 | A1* | 1/2022 | Miyazawa | H01L 21/568 |
| 2022/0077101 | A1* | 3/2022 | Morita | H01L 21/30 |
| 2022/0319872 | A1* | 10/2022 | Akasu | H01L 21/561 |
| 2022/0399313 | A1* | 12/2022 | Park | H01L 33/20 |

FOREIGN PATENT DOCUMENTS

| | | |
|---|---|---|
| JP | 2003-174153 | 6/2003 |
| JP | 2004-64040 | 2/2004 |
| JP | 2005-159155 | 6/2005 |
| JP | 2006-80142 | 3/2006 |
| JP | 2012-109538 | 6/2012 |
| JP | 2012-126803 | 7/2012 |
| JP | 2012-206266 | 10/2012 |
| JP | 2013-33814 | 2/2013 |
| JP | 2013-110352 | 6/2013 |
| JP | 2015-13977 | 1/2015 |
| JP | 2016-11361 | 1/2016 |
| JP | 2016-138182 | 8/2016 |
| TW | 200525770 | 8/2005 |

OTHER PUBLICATIONS

International Search Report dated Feb. 13, 2018 in corresponding International (PCT) Application No. PCT/JP2017/043363.

\* cited by examiner

SEMICONDUCTOR DEVICE MANUFACTURING METHOD, CURABLE RESIN COMPOSITION FOR TEMPORARY FIXATION MATERIAL, FILM FOR TEMPORARY FIXATION MATERIAL, AND LAMINATED FILM FOR TEMPORARY FIXATION MATERIAL

TECHNICAL FIELD

The present invention relates to a semiconductor device manufacturing method, a curable resin composition for a temporary fixation material, a film for a temporary fixation material, and a laminated film for a temporary fixation material.

BACKGROUND ART

In the field of semiconductor devices, in recent years, technologies related to a package called system in package (SIP), in which a plurality of semiconductor elements is laminated, are significantly growing. In a SIP type package, since a large number of semiconductor elements are laminated, there is a demand for thickness reduction in the semiconductor elements. In response to this demand, in a semiconductor element, an integrated circuit is incorporated into a semiconductor member (for example, a semiconductor wafer), and then, for example, the semiconductor member is subjected to processing treatments such as thickness reduction by grinding the rear surface of the semiconductor member, and individualization by dicing the semiconductor wafer. These semiconductor member processing treatments are usually carried out by temporarily fixing a semiconductor member to a supporting member by means of a temporary fixation material layer (see, for example, Patent Literatures 1 to 3).

The semiconductor member that has been subjected to processing treatments is strongly fixed to the supporting member, with the temporary fixation material layer interposed therebetween. Therefore, in the semiconductor device manufacturing method, it is required that the semiconductor member after the processing treatments can be separated from the supporting member while damage to the semiconductor member and the like are prevented. In Patent Literature 1, as a method for separating such a semiconductor member, a method of physically separating the semiconductor member while heating the temporary fixation material layer is disclosed. Furthermore, in Patent Literatures 2 and 3, methods of separating a semiconductor member by irradiating the temporary fixation material layer with laser light (coherent light) are disclosed.

CITATION LIST

Patent Literature

Patent Literature 1: JP No. 2012-126803
Patent Literature 2: JP No. 2016-138182
Patent Literature 3: JP No. 2013-033814

SUMMARY OF INVENTION

Technical Problem

However, in the method disclosed in Patent Literature 1, there is a problem that damage caused by thermal history and the like occur in the semiconductor wafer, and the product yield is decreased. On the other hand, the methods disclosed in Patent Literatures 2 and 3 have the following problems: since the laser light is coherent light, the area of irradiation is narrow, and there is a need to irradiate the entire semiconductor member repeatedly for several times, it takes much time; since scanning and irradiation are achieved by controlling the focus of laser light, the process becomes complicated; and highly expensive apparatuses are needed.

The present invention was achieved in view of such circumstances, and it is an object of the invention to provide a semiconductor device manufacturing method, by which a temporarily fixed semiconductor member can be easily separated from a supporting member. Furthermore, it is another object of the present invention to provide a curable resin composition for a temporary fixation material, a film for a temporary fixation material, and a laminated film for a temporary fixation material, all of which are useful as temporary fixation materials.

Solution to Problem

According to an aspect of the present invention, there is provided a semiconductor device manufacturing method comprising a preparation step of preparing a laminated body in which a supporting member, a temporary fixation material layer that generates heat upon absorbing light, and a semiconductor member are laminated in this order, and a separation step of irradiating the temporary fixation material layer in the laminated body with incoherent light and thereby separating the semiconductor member from the supporting member.

A light source for the incoherent light in the separation step may be a xenon lamp. The incoherent light in the separation step may be light including at least infrared light.

The separation step may be a step of irradiating the temporary fixation material layer with the incoherent light through the supporting member.

According to an embodiment, the temporary fixation material layer may contain a cured product of a curable resin composition including electroconductive particles that generate heat upon absorbing light.

A content of the electroconductive particles may be 30 to 90 parts by mass with respect to a total amount of 100 parts by mass of components other than the electroconductive particles in the curable resin composition.

The curable resin composition may further include a thermoplastic resin. The curable resin composition may further include a polymerizable monomer and a polymerization initiator.

According to another embodiment, the temporary fixation material layer may have a light absorbing layer that generates heat upon absorbing light, and a resin cured product layer including a cured product of a curable resin component.

The light absorbing layer may be formed by sputtering or vacuum vapor deposition.

According to another aspect, the present invention provides a curable resin composition for a temporary fixation material for temporarily fixing a semiconductor member to a supporting member, the curable resin composition for a temporary fixation material including electroconductive particles that generate heat upon absorbing light.

A content of the electroconductive particles may be 30 to 90 parts by mass with respect to a total amount of 100 parts by mass of components other than the electroconductive particles in the curable resin composition for a temporary fixation material.

The curable resin composition for a temporary fixation material may further include a thermoplastic resin. Furthermore, the curable resin composition for a temporary fixation material may further include a polymerizable monomer and a polymerization initiator.

Furthermore, the present invention may also relate to the application as a temporary fixation material or the application for the production of a temporary fixation material, of a curable resin composition containing electroconductive particles that generate heat upon absorbing light.

According to another aspect, the present invention provides a film for a temporary fixation material for temporarily fixing a semiconductor member to a supporting member, the film for a temporary fixation material including the above-described curable resin composition for a temporary fixation material.

Furthermore, according to another aspect, the present invention provides a laminated film for a temporary fixation material for temporarily fixing a semiconductor member to a supporting member, the laminated film for a temporary fixation material having a light absorbing layer that generates heat upon absorbing light, and a resin layer including a curable resin component.

Advantageous Effects of Invention

According to the present invention, there is provided a semiconductor device manufacturing method by which a temporarily fixed semiconductor member can be easily separated from a supporting member. Furthermore, according to the present invention, a curable resin composition for a temporary fixation material, a film for a temporary fixation material, and a laminated film for a temporary fixation material, all of which are useful as temporary fixation materials, are provided. The curable resin composition for a temporary fixation material according to several embodiments enables the formation of a temporary fixation material layer having excellent heat resistance.

BRIEF DESCRIPTION OF DRAWINGS

FIG. 1 is a schematic cross-sectional view for describing an embodiment of a semiconductor device manufacturing method of the present invention.

DESCRIPTION OF EMBODIMENTS

Hereinafter, embodiments of the present invention will be described with appropriate reference to the drawings. However, the present invention is not intended to be limited to the following embodiments. In the following embodiments, the constituent elements thereof (also including steps and the like) are not essential unless particularly stated otherwise. The sizes of the constituent elements in the respective drawings are merely conceptual, and the relative relationship between the sizes of the constituent elements is not limited to that illustrated in the respective drawings.

The same also applies to the numerical values and ranges thereof in the present specification, and the numerical values and the ranges thereof are not intended to limit the present invention. A numerical value range expressed using "to" in the present specification represents a range including the numerical values described before and after "to" as the minimum value and the maximum value, respectively. With regard to numerical value ranges described stepwise in the present specification, the upper limit or lower limit described in one numerical value range may be substituted with the upper limit or lower limit of another numerical value range described stepwise. Furthermore, with regard to a numerical value range described in the present specification, the upper limit or lower limit of the numerical value range may be substituted with a value shown in the Examples.

In the present specification, (meth)acrylic acid means acrylic acid, or methacrylic acid corresponding thereto. The same also applies to other similar expressions such as (meth)acrylate and (meth)acryloyl group.

[Semiconductor Device Manufacturing Method]

The semiconductor device manufacturing method according to the present embodiment includes a preparation step of preparing a laminated body in which a supporting member, a temporary fixation material layer that generates heat upon absorbing light (hereinafter, may be simply referred to as "temporary fixation material layer"), and a semiconductor member are laminated in this order, and a separation step of irradiating the temporary fixation material layer in the laminated body with incoherent light and thereby separating the semiconductor member from the supporting member.

<Preparation Step for Laminated Body>

Figure 1A:
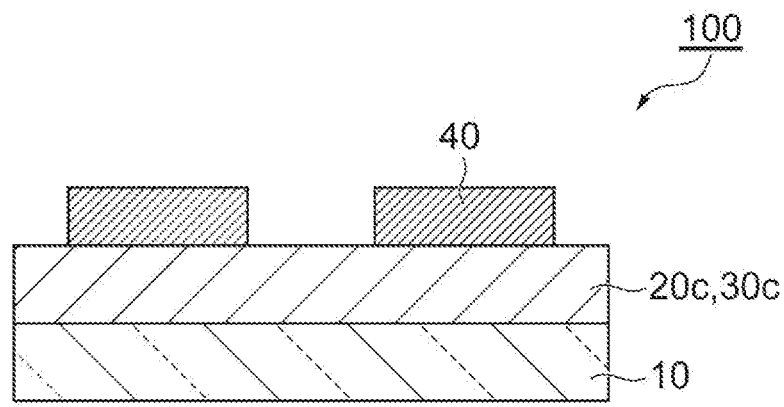
FIGS. 1(a) and 1(b) are schematic cross-sectional views illustrating the respective steps.
Figure 1B:
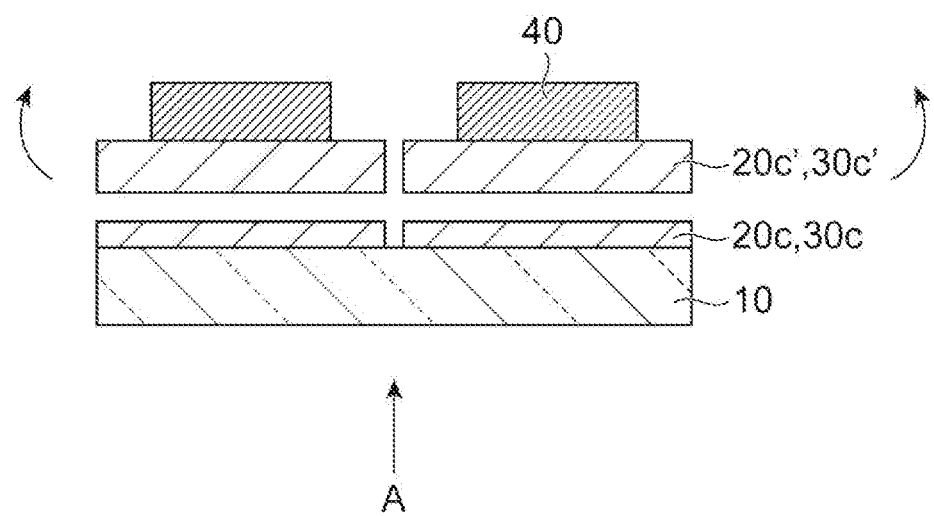

FIG. 1 is a schematic cross-sectional view for describing an embodiment of the semiconductor device manufacturing method of the present invention, and FIGS. 1(a) and 1(b) are schematic cross-sectional views illustrating the respective steps. As illustrated in FIG. 1(a), in the preparation step for a laminated body, a laminated body 100 in which a supporting member 10, a temporary fixation material layer 20c or 30c, and a semiconductor member 40 are laminated in this order, is prepared.

The supporting member 10 is not particularly limited; however, for example, the supporting member may be a glass substrate, a resin substrate, a silicon wafer, a metal thin film, or the like. The supporting member 10 may be any substrate that does not obstruct transmission of light, and may be a glass substrate.

The thickness of the supporting member 10 may be, for example, 0.1 to 2.0 mm. When the thickness is 0.1 mm or more, handling tends to become easier, and when the thickness is 2.0 mm or less, there is a tendency that the material cost can be suppressed.

The temporary fixation material layer 20c or 30c is a layer for temporarily fixing the supporting member 10 and the semiconductor member 40, and is a layer that absorbs light when irradiated with light and then generates heat. The light that is an object of absorption for the temporary fixation material layer 20c or 30c may be light including any of infrared light, visible light, or ultraviolet light. The temporary fixation material layer 20c or 30c may include, as will be described below, electroconductive particles that generate heat upon absorbing light (hereinafter, may be simply referred to as "electroconductive particles"), and may have a light absorbing layer that generates heat upon absorbing light (hereinafter, may be simply referred to as "light absorbing layer"). Since the electroconductive particles and the light absorbing layer can efficiently generate heat, the light that is the object of absorption for the temporary fixation material layer 20c or 30c may be light including at least infrared light. Furthermore, the temporary fixation material layer 20c or 30c may be any layer that when absorbs the infrared light irradiated with light including infrared light, and then generates heat.

The laminated body 100 illustrated in FIG. 1(a) can be produced by, for example, forming a temporary fixation material precursor layer including a curable resin component on a supporting member, disposing a semiconductor member on the temporary fixation material precursor layer, curing the curable resin component in the temporary fixation material precursor layer, and forming a temporary fixation material layer including a cured product of the curable resin component.

Temporary Fixation Material Precursor Layer: First Embodiment

Figure 2:
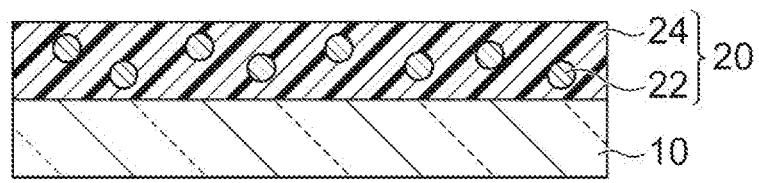
FIG. 2 is a schematic cross-sectional view illustrating an embodiment of a temporary fixation material precursor layer.

The temporary fixation material precursor layer according to an embodiment contains a curable resin composition including electroconductive particles that generate heat upon absorbing light. FIG. 2 is a schematic cross-sectional view illustrating an embodiment of the temporary fixation material precursor layer. A temporary fixation material precursor layer 20 can be configured to include electroconductive particles 22 and a curable resin component 24 as illustrated in FIG. 2. That is, the curable resin composition may be any composition containing the electroconductive particles and the curable resin component. The curable resin component 24 may be a curable resin component that is cured by heat or light.

The electroconductive particles 22 are not particularly limited as long as the electroconductive particles 22 generate heat upon absorbing light; however, the electroconductive particles 22 may be any particles that generate heat upon absorbing infrared light. The electroconductive particles 22 may be, for example, at least one selected from the group consisting of silver powder, copper powder, nickel powder, aluminum powder, chromium powder, iron powder, brass powder, tin powder, a titanium alloy, gold powder, a copper alloy powder, copper oxide powder, silver oxide powder, tin oxide powder, and electroconductive carbon powder. From the viewpoints of handleability and safety, the electroconductive particles 22 may also be at least one selected from the group consisting of silver powder, copper powder, silver oxide powder, copper oxide powder, and carbon powder. Furthermore, the electroconductive particles 22 may be particles having a core formed from a resin or a metal and having this core plated with a metal such as nickel, gold, or silver. Moreover, the electroconductive particles 22 may be particles having the surface treated with a surface treatment agent, from the viewpoint of dispersibility in a solvent.

The surface treatment agent may be, for example, a silane coupling agent. Examples of the silane coupling agent include 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-mercaptopropylmethyldimethoxysilane, 3-mercaptopropyltrimethoxysilane, bis(triethoxypropyl) tetrasulfide, and 3-isocyanatopropyltriethoxysilane.

The shape of the electroconductive particles 22 is not particularly limited and may be a particulate shape, a flat shape, or the like. In a case in which the electroconductive particles 22 are a carbon powder, the electroconductive particles may also be in a particulate form, a tubular form, a wire-like form, or the like.

The average particle size of the electroconductive particles 22 may be, for example, 0.1 to 5.0 sm. Here, the average particle size is the particle size when the ratio (volume fraction) with respect to the total volume of the electroconductive particles 22 is 50% ($D_{50}$). The average particle size ($D_{50}$) of the electroconductive particles 22 is obtained by measuring a suspension obtained by suspending a positive electrode active material in water by a laser scattering method, using a laser scattering type particle size analyzer (for example, MICROTRAC).

The content of the electroconductive particles 22 may be 30 to 90 parts by mass with respect to a total amount of 100 parts by mass of the components other than the electroconductive particles in the curable resin composition. Meanwhile, the components other than the electroconductive particles in the curable resin composition do not include the solvent that will be described below. The content of the electroconductive particles 22 may be 35 parts by mass or more, 40 parts by mass or more, or 45 parts by mass or more. When the content of the electroconductive particles 22 is 30 parts by mass or more with respect to a total amount of 100 parts by mass of the components other than the electroconductive particles in the curable resin composition, there is a tendency that separation from the supporting member can be achieved by irradiation with incoherent light of lower energy. The content of the electroconductive particles 22 may be 80 parts by mass or less, 70 parts by mass or less, or 60 parts by mass or less. When the content of the electroconductive particles 22 is 90 parts by mass or less with respect to a total amount of 100 parts by mass of the components other than the electroconductive particles in the temporary fixation material layer, there is a tendency that flatness of the temporary fixation material layer is easily secured.

The curable resin composition may contain a thermoplastic resin, a polymerizable monomer, and a polymerization initiator.

The thermoplastic resin may be a resin having thermoplasticity, or a resin that has thermoplasticity at least in an uncured state and forms a crosslinked structure after being heated. Examples of the thermoplastic resin include an elastomer, a polycarbonate, polyphenylene sulfide, a polyether sulfone, a polyetherimide, a polyimide, a petroleum resin, and a novolac resin. These may be used singly or in combination of two or more kinds thereof. Among these, from the viewpoints of bump embedability and low temperature stickability, the thermoplastic resin may be an elastomer.

Specific examples of the elastomer include an ethylene-propylene copolymer elastomer, an ethylene-1-butene copolymer elastomer, an ethylene-propylene-1-butene copolymer elastomer, an ethylene-1-hexene copolymer elastomer, an ethylene-1-octene copolymer elastomer, an ethylene-styrene copolymer elastomer, an ethylene-norbornene copolymer elastomer, a propylene-1-butene copolymer elastomer, an ethylene-propylene-non-conjugated diene copolymer elastomer, an ethylene-1-butene-non-conjugated diene copolymer elastomer, an ethylene-propylene-1-butene-non-conjugated diene copolymer elastomer, polyisoprene, polybutadiene, a carboxyl group-terminated polybutadiene, a hydroxyl group-terminated polybutadiene, 1,2-polybutadiene, a carboxyl group-terminated 1,2-polybutadiene, a hydroxyl group-terminated 1,2-polybutadiene, acrylic rubber, styrene-butadiene rubber, a hydroxyl group-terminated styrene-butadiene rubber, acrylonitrile-butadiene rubber, an acrylonitrile-butadiene rubber containing a carboxyl group, a hydroxyl group, a (meth)acryloyl group, or a morpholine group at the polymer terminals, a carboxylated nitrile rubber, a hydroxyl group-terminated poly(oxypropylene), an alkoxysilyl group-terminated poly(oxypropylene), poly(oxytetramethylene) glycol, a polyolefin glycol, and poly-ε-caprolactone. These elastomers may be subjected to a hydrogenation treatment. Among these, the elastomer may be an elastomer including a monomer unit derived from styrene.

The Tg of the thermoplastic resin may be −100° C. to 500° C., −50° C. to 300° C., or −50° C. to 50° C. When the Tg of the thermoplastic resin is 500° C. or lower, flexibility is easily secured at the time of forming a film-like temporary fixation material, and there is a tendency that the low temperature stickability can be enhanced. When the Tg of the thermoplastic resin is −100° C. or higher, there is a tendency that deterioration of handleability and detachability caused by excessive increase in flexibility at the time of forming a film-like temporary fixation material can be suppressed.

The Tg of the thermoplastic resin is a mid-point glass transition temperature obtainable by differential scanning calorimetry (DSC). The Tg of the thermoplastic resin is specifically a mid-point glass transition temperature calculated according to a method equivalent to JIS K 7121 by measuring the calorific change under the conditions of a rate of temperature increase of 10° C./min and a measurement temperature of −80° C. to 80° C.

The weight average molecular weight (Mw) of the thermoplastic resin may be 10000 to 5000000 or 100000 to 2000000. When the weight average molecular weight is 10000 or more, the heat resistance of the temporary fixation material layer to be formed tends to be easily secured. When the weight average molecular weight is 5000000 or less, there is a tendency that deterioration of flow and deterioration of stickability are easily suppressed at the time of forming a film-like temporary fixation material layer. Meanwhile, the weight average molecular weight is a polystyrene-converted value obtained using a calibration curve based on standard polystyrene by gel permeation chromatography (GPC).

The content of the thermoplastic resin may be 10 to 90 parts by mass with respect to a total amount of 100 parts by mass of the components other than the electroconductive particles in the curable resin composition. The content of the thermoplastic resin may be 30 parts by mass or more, 50 parts by mass or more, or 70 parts by mass or more, and may be 88 parts by mass or less, 85 parts by mass or less, or 82 parts by mass or less. When the content of the thermoplastic resin is in the above-described range, the thin film-formability and flatness of the temporary fixation material layer tend to be superior.

The polymerizable monomer is not particularly limited as long as it is polymerized by heating or irradiation with ultraviolet light or the like. From the viewpoints of the selectivity of material and easy availability, the polymerizable monomer may be, for example, a compound having a polymerizable functional group such as an ethylenically unsaturated group. Examples of the polymerizable monomer include a (meth)acrylate, a halogenated vinylidene, a vinyl ether, a vinyl ester, vinylpyridine, a vinyl amide, and an arylated vinyl. Among these, the polymerizable monomer may be a (meth)acrylate. The (meth)acrylate may be any of a monofunctional (unifunctional), bifunctional, or trifunctional or higher-functional (meth)acrylate; however, from the viewpoint of obtaining sufficient curability, the (meth)acrylate may be a bifunctional or higher-functional (meth)acrylate.

Examples of a monofunctional (meth)acrylate include (meth)acrylic acid; aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono (2-(meth)acryloyloxyethyl) succinate; and aromatic (meth)acrylates such as benzyl (meth)acrylate, phenyl (meth)acrylate, o-biphenyl (meth)acrylate, I-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonylphenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(I-naphthoxy)propyl (meth)acrylate, and 2-hydroxy-3-(2-naphthoxy)propyl (meth)acrylate.

Examples of a bifunctional (meth)acrylate include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; and aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth) acrylate, propoxylated bisphenol F di(meth)acrylate, ethoxylated propoxylated bisphenol F di(meth)acrylate, ethoxylated fluorene type di(meth)acrylate, propoxylated fluorene type di(meth)acrylate, and ethoxylated propoxylated fluorene type di(meth)acrylate.

Examples of a polyfunctional (meth)acrylate of trifunctionality or higher functionality include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri (meth)acrylate, propoxylated pentaerythritol tri(meth)acrylate, ethoxylated propoxylated pentaerythritol tri(meth) acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylolpropane tetraacrylate, and dipentaerythritol hexa(meth)acrylate; and aromatic epoxy (meth)acrylates such as phenol novolac type epoxy (meth)acrylate and cresol novolac type epoxy (meth) acrylate.

These (meth)acrylates may be used singly or in combination of two or more kinds thereof. Furthermore, these (meth)acrylates may also be used in combination with other polymerizable monomers.

The content of the polymerizable monomer may be 10 to 90 parts by mass with respect to a total amount of 100 parts by mass of the components other than the electroconductive particles in the curable resin composition. The content of the polymerizable monomer may be 12 parts by mass or more, 15 parts by mass or more, or 18 parts by mass or more. When the content of the polymerizable monomer is 10 parts by mass or more with respect to a total amount of 100 parts by mass of the components other than the electroconductive particles in the temporary fixation material layer, the heat resistance of the temporary fixation material layer tends to be excellent. The content of the polymerizable monomer may be 70 parts by mass or less, 50 parts by mass or less, or 30 parts by mass or less. When the content of the polymerizable monomer is 90 parts by mass or less with respect to a total amount of 100 parts by mass of the components other than the electroconductive particles in the curable resin composition, there is a tendency that detachment, damage, and the like during the processes can be suppressed.

The polymerization initiator is not particularly limited as long as it is an agent that initiates polymerization as a result of heating or irradiation with ultraviolet light or the like. For example, in a case in which a compound having an ethylenically unsaturated group is used as a polymerizable monomer, the polymerizable initiator may be a thermal radical polymerization initiator or a photoradical polymerization initiator.

Examples of the thermal radical polymerization initiator include diacyl peroxides such as octanoyl peroxide, lauroyl peroxide, stearyl peroxide, and benzoyl peroxide; peroxy esters such as t-butyl peroxypivalate, t-hexyl peroxypivalate, 1,1,3,3-tetramethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxyisopropyl monocarbonate, t-butyl peroxy-3,5,5-trimethylhexanoate, t-butyl peroxylaurylate, t-butyl peroxyisopropyl monocarbonate, t-butyl peroxy-2-ethylhexyl monocarbonate, t-butyl peroxybenzoate, t-hexyl peroxybenzoate, 2,5-dimethyl-2,5-bis (benzoylperoxy)hexane, and t-butylperoxyacetate; and azo compounds such as 2,2'-azobisisobutyronitrile, 2,2'-azobis (2,4-dimethylvaleronitrile), and 2,2'-azobis(4-methoxy-2'-dimethylvaleronitrile).

Examples of the photoradical polymerization initiator include benzoin ketals such as 2,2-dimethoxy-1,2-diphenylethan-1-one; α-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; and phosphine oxides such as bis (2,4,6-trimethylbenzoyl)phenyl phosphine oxide, bis(2,6-dimethoxybenzoyl)-2,4,4-trimethylpentyl phosphine oxide, and 2,4,6-trimethylbenzoyl diphenyl phosphine oxide.

These thermal and photoradical polymerization initiators may be used singly or in combination of two or more kinds thereof.

The content of the polymerization initiator may be 0.01 to 5 parts by mass with respect to a total amount of 100 parts by mass of the polymerizable monomer. The content of the polymerization initiator may be 0.03 parts by mass or more, or 0.05 parts by mass or more. When the content of the polymerization initiator is 0.01 parts by mass or more with respect to a total amount of 100 parts by mass of the polymerizable monomer, curability is enhanced, and heat resistance tends to become more satisfactory. The content of the polymerization initiator may be 3 parts by mass or less, 1 part by mass or less, or 0.1 parts by mass or less. When the content of the polymerizable initiator is 5 parts by mass or less with respect to a total amount of 100 parts by mass of the polymerizable monomer, there is a tendency that gas generation during the process can be suppressed.

The curable resin composition may further contain, if necessary, a thermosetting resin, a curing accelerator, an insulative filler, a sensitizer, an oxidation inhibitor, and the like.

The thermosetting resin is not particularly limited as long as it is a resin that is cured by heat. Examples of the thermosetting resin include an epoxy resin, an acrylic resin, a silicone resin, a phenolic resin, a thermosetting polyimide resin, a polyurethane resin, a melamine resin, and a urea resin. These may be used singly or in combination of two or more kinds thereof. Among these, the thermosetting resin may be an epoxy resin since an epoxy resin has superior heat resistance, workability, and reliability. In a case in which an epoxy resin is used as the thermosetting resin, the epoxy resin may be used in combination with an epoxy resin curing agent.

The epoxy resin is not particularly limited as long as it has heat-resistant action when cured. Examples of the epoxy resin include bifunctional epoxy resins such as a bisphenol A type epoxy; and novolac type epoxy resins such as a phenol novolac type epoxy resin and a cresol novolac type epoxy resin. Furthermore, the epoxy resin may be a polyfunctional epoxy resin, a glycidylamine type epoxy resin, a heterocyclic ring-containing epoxy resin, or an alicyclic epoxy resin.

Regarding the epoxy resin curing agent, any known curing agent that is conventionally used can be used. Examples of the epoxy resin curing agent include an amine; a polyamide; an acid anhydride; a polysulfide; boron trifluoride; bisphenols each having two or more phenolic hydroxyl groups in one molecule, such as bisphenol A, bisphenol F, and bisphenol S; and phenolic resins such as a phenol novolac resin, a bisphenol A novolac resin, and a cresol novolac resin.

The content of the thermosetting resin and the curing agent may be 10 to 90 parts by mass with respect to a total amount of 100 parts by mass of the components other than the electroconductive particles in the curable resin composition. When the content of the thermosetting resin and the curing agent is in the above-described range, heat resistance tends to become more satisfactory.

Examples of the curing accelerator include an imidazole derivative, a dicyandiamide derivative, a dicarboxylic acid dihydrazide, triphenylphosphine, tetraphenylphosphonium tetraphenylborate, 2-ethyl-4-methylimidazole tetraphenylborate, and 1,8-diazabicyclo[5,4,0]undecene-7-tetraphenylborate. These may be used singly or in combination of two or more kinds thereof.

The content of the curing accelerator may be 0.01 to 5 parts by mass with respect to a total amount of 100 parts by mass of the thermosetting resin and the curing agent. When the content of the curing accelerator is in the above-described range, curability is enhanced, and heat resistance tends to become more satisfactory.

An insulative filler is added for the purpose of imparting low thermal expandability and low hygroscopic properties to a resin composition. Examples of the insulative filler include non-metal inorganic fillers such as silica, alumina, boron nitride, titania, glass, and ceramic. These insulative fillers may be used singly or in combination of two or more kinds thereof. From the viewpoint of dispersibility in a solvent, the insulative filler may be particles having the surface treated with a surface treatment agent. Regarding the surface treatment agent, agents similar to the above-mentioned silane coupling agents can be used.

The content of the insulative filler may be 5 to 20 parts by mass with respect to a total amount of 100 parts by mass of the components other than the electroconductive particles in the curable resin composition. When the content of the insulative filler is in the above-described range, heat resistance tends to be further enhanced without obstructing light transmission. Furthermore, there is also a possibility of contributing to light detachability.

Examples of the sensitizer include anthracene, phenanthrene, chrysene, benzopyrene, fluoranthene, rubrene, pyrene, xanthone, indanthrene, thioxanthen-9-one, 2-isopropyl-9H-thioxanthen-9-one, 4-isopropyl-9H-thioxanthen-9-one, and 1-chloro-4-propoxythioxanthone.

The content of the sensitizer may be 0.01 to 10 parts by mass with respect to a total amount of 100 parts by mass of the components other than the electroconductive particles in the curable resin composition. When the content of the sensitizer is in the above-described range, the influence on the characteristics and thin film properties of the curable resin component tends to be small.

Examples of the oxidation inhibitor include quinone derivatives such as benzoquinone and hydroquinone; phenol derivatives such as 4-methoxyphenol and 4-t-butylcatechol; aminoxyl derivatives such as 2,2,6,6-tetramethylpiperidin-1-oxyl and 4-hydroxy-2,2,6,6-tetramethylpiperidin-1-oxyl; and hindered amine derivatives such as tetramethylpiperidyl methacrylate.

The content of the oxidation inhibitor may be 0.1 to 10 parts by mass with respect to a total amount of 100 parts by mass of the components other than the electroconductive particles in the curable resin composition. When the content of the oxidation inhibitor is in the above-described range, decomposition of the curable resin component is suppressed, and there is a tendency that contamination can be prevented.

The temporary fixation material precursor layer 20 can be formed from a curable resin composition containing electroconductive particles 22 and a curable resin component 24 (a thermoplastic resin, a polymerizable monomer, a polymerization initiator, and the like).

The curable resin composition may be used as a varnish of the curable resin composition, which has been diluted with a solvent. The solvent is not particularly limited as long as the solvent can dissolve components other than the electroconductive particles 22 and an insulative filler. Examples of the solvent include aromatic hydrocarbons such as toluene, xylene, mesitylene, cumene, and p-cymene; aliphatic hydrocarbons such as hexane and heptane; cyclic alkanes such as methylcyclohexane; cyclic ethers such as tetrahydrofuran and 1,4-dioxane; ketones such as acetone, methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methyl-2-pyrrolidone. These solvents may be used singly or in combination of two or more kinds thereof. Among these, from the viewpoints of solubility and the boiling point, the solvent may be toluene, xylene, heptane, or cyclohexane.

The solid component concentration in the varnish may be 10% to 80% by mass based on the total mass of the varnish.

The curable resin composition can be prepared by mixing and kneading the electroconductive particles 22 and the curable resin component 24 (a thermoplastic resin, a polymerizable monomer, a polymerization initiator, and the like). Mixing and kneading can be carried out by appropriately combining conventional dispersing machines such as a stirrer, a Raikai mixer, a three-roll mill, and a bead mill.

The curable resin composition may be formed into a film form. A curable resin composition formed into a film form (hereinafter, may be referred to as "film for a temporary fixation material") can be formed by applying the curable resin composition on a supporting film. In the case of using a varnish of the curable resin composition, which has been diluted with a solvent, the film for a temporary fixation material can be formed by applying the curable resin composition on a supporting film and removing the solvent by heating and drying.

The thickness of the film for a temporary fixation material can be adjusted in accordance with the desired thickness of the temporary fixation material layer. The thickness of the film for a temporary fixation material may be 0.1 to 2000 μm (2 mm) or 10 to 500 μm, from the viewpoint of stress relaxation.

The supporting film is not particularly limited, and examples include films of polyesters such as polyethylene terephthalate (PET), polybutylene terephthalate, and polyethylene naphthalate; polyolefins such as polyethylene and polypropylene; polycarbonate, polyamide, polyimide, polyamideimide, polyetherimide, polyether sulfide, polyether sulfone, polyether ketone, polyphenylene ether, polyphenylene sulfide, poly(meth)acrylate, polysulfone, and a liquid crystal polymer. These may be subjected to a mold release treatment. The thickness of the supporting film may be, for example, 3 to 250 µm.

Regarding a method of applying the curable resin composition on a supporting film, for example, a spin coating method, a spraying method, a printing method, a film transfer method, a slit coating method, a scan coating method, an inkjet method, and the like may be mentioned.

The film for a temporary fixation material provided on the supporting film may be provided with a protective film, if necessary. Regarding the protective film, for example, polyesters such as polyethylene terephthalate, polybutylene terephthalate, and polyethylene naphthalate; polyolefins such as polyethylene and polypropylene; and the like may be mentioned. The thickness of the protective film may be, for example, 10 to 250 µm.

The film for a temporary fixation material can be easily stored by, for example, winding into a roll form. Furthermore, a film for a temporary fixation material in a roll form can also be cut into a suitable size into a sheet form and stored.

The temporary fixation material precursor layer 20 can be formed by applying the curable resin composition directly on a supporting member 10. In the case of using a varnish of the curable resin composition, which has been diluted with a solvent, the temporary fixation material precursor layer 20 can be formed by applying the curable resin composition on the supporting member 10 and removing the solvent by heating and drying.

The method of applying the curable resin composition directly on the supporting member 10 may be similar to the method of applying the curable resin composition on a supporting film.

The temporary fixation material precursor layer 20 can also be formed by laminating the film for a temporary fixation material that has been produced in advance, with the supporting member 10. Lamination can be carried out using a roll laminator, a vacuum laminator, or the like under predetermined conditions (for example, room temperature (20° C.) or in a heated state).

The thickness of the temporary fixation material precursor layer 20 may be 0.1 to 2000 µm (0.0001 to 2 mm) or 10 to 500 µm, from the viewpoint of stress relaxation.

Temporary Fixation Material Precursor Layer: Second Embodiment

Figure 5A:
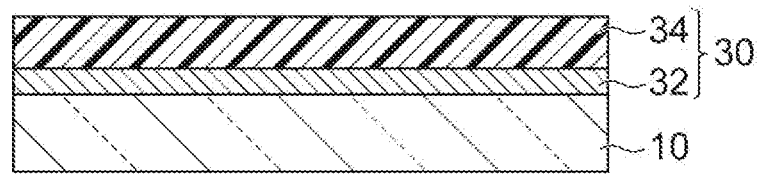
FIGS. 5(a), 5(b), and 5(c) are schematic cross-sectional views illustrating another embodiment of the temporary fixation material precursor layer.
Figure 5B:
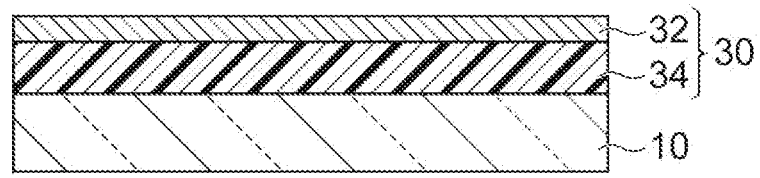
Figure 5C:
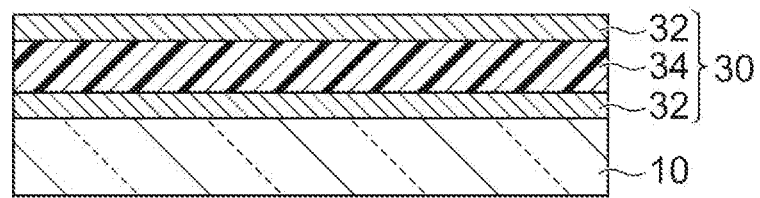

As another embodiment, the temporary fixation material precursor layer has a light absorbing layer that generates heat upon absorbing light, and a resin layer including a curable resin component. FIGS. 5(a), 5(b), and 5(c) are schematic cross-sectional views illustrating another embodiment of the temporary fixation material precursor layer. Regarding the temporary fixation material precursor layer 30, the configuration is not particularly limited as long as the configuration has a light absorbing layer 32 and a resin layer 34; however, examples include a configuration having a light absorbing layer 32 and a resin layer 34 in this order from the supporting member 10 side (FIG. 5(a)); a configuration having a resin layer 34 and a light absorbing layer 32 in this order from the supporting member 10 side (FIG. 5(b)); a configuration having a light absorbing layer 32, a resin layer 34, and a light absorbing layer 32 in this order (FIG. 5(c)); and the like. Among these, the temporary fixation material precursor layer 30 may have a configuration having a light absorbing layer 32 and a resin layer 34 in this order from the supporting member 10 side (FIG. 5(a)). In the following description, an embodiment of using a temporary fixation material precursor layer 30 having the configuration illustrated in FIG. 5(a) will be mainly described in detail.

An embodiment of the light absorbing layer 32 is a layer formed from an electrical conductor that generates heat upon absorbing light (hereinafter, may be simply referred to "conductor") (hereinafter, may be referred to as "conductor layer"). The conductor that constitutes such a conductor layer is not particularly limited as long as it is a conductor that generates heat upon absorbing light; however, the conductor may be any conductor that generates heat upon absorbing infrared light. Examples of the conductor include metals such as chromium, copper, titanium, silver, platinum, and gold; alloys such as nickel-chromium, stainless steel, and copper-zinc; metal oxides such as indium tin oxide (ITO), zinc oxide, and niobium oxide; and carbon materials such an electroconductive carbon. These may be used singly or in combination of two or more kinds thereof. Among these, the conductor may be chromium, titanium, copper, aluminum, silver, gold, platinum, or carbon.

The light absorbing layer 32 may be configured to have a plurality of conductor layers. Such a light absorbing layer may be, for example, a light absorbing layer configured to include a first conductor layer that is provided on a supporting member 10, and a second conductor layer provided on a surface of the first conductor layer, the surface being on the opposite side of the supporting member 10, or the like. The conductor in the first conductor layer may be titanium, from the viewpoints of the adhesiveness to the supporting member (for example, glass), film-forming properties, heat conductivity, low heat capacity, and the like. The conductor in the second conductor layer may be copper, aluminum, silver, gold, or platinum from the viewpoints of high coefficient of expansion, high thermal conduction, and the like, and among these, the conductor is preferably copper or aluminum.

The light absorbing layer 32 can be formed directly on the supporting member 10 by subjecting these conductors to physical vapor deposition (PVD) such as vacuum vapor deposition or sputtering, or to chemical vapor deposition (CVD) such as electroplating, electroless plating, or plasma chemical vapor deposition. Among these, since a conductor layer can be formed in a large area, the conductor layer may be formed using physical vapor deposition, or may be formed using sputtering or vacuum vapor deposition.

The thickness of an embodiment of the light absorbing layer 32 may be 1 to 5000 nm (0.001 to 5 µm) or 50 to 3000 nm (0.05 to 3 µm), from the viewpoint of light detachability. In a case in which the light absorbing layer 32 is configured to include a first conductor layer and a second conductor layer, the thickness of the first conductor layer may be 1 to 1000 nm, 5 to 500 nm, or 10 to 100 nm, and the thickness of the second conductor layer may be 1 to 5000 nm, 10 to 500 nm, or 50 to 200 nm.

Another embodiment of the light absorbing layer 32 is a layer containing a cured product of the curable resin composition including electroconductive particles that generate heat upon absorbing light. The curable resin composition may be a composition containing electroconductive particles and a curable resin component. The curable resin component may be a curable resin component that is cured by heat or light. The electroconductive particles may be similar to those mentioned above as examples of the electroconductive particles 22. The curable resin component is not particularly limited; however, for example, those mentioned above as examples of the curable resin component according to the first embodiment of the temporary fixation material precursor layer may be used.

The content of the electroconductive particles may be 10 to 90 parts by mass with respect to a total amount of 100 parts by mass of the components other than the electroconductive particles in the curable resin composition. Meanwhile, the components other than the electroconductive particles in the curable resin composition do not include the organic solvent that will be described below. The content of the electroconductive particles may be 15 parts by mass or more, 20 parts by mass or more, or 25 parts by mass or more. The content of the electroconductive particles may be 80 parts by mass or less or 50 parts by mass or less.

The curable resin composition may contain a thermosetting resin, a curing agent, and a curing accelerator. The content of the thermosetting resin may be 10 to 90 parts by mass with respect to a total amount of 100 parts by mass of the components other than the electroconductive particles in the curable resin composition. The content of the curing agent and the curing accelerator may be 0.01 to 5 parts by mass with respect to a total amount of 100 parts by mass of the thermosetting resin.

The light absorbing layer 32 can be formed from a curable resin composition including electroconductive particles that generate heat upon absorbing light. The curable resin composition may be used as a varnish of the curable resin composition, which has been diluted with an organic solvent. Examples of the organic solvent include acetone, ethyl acetate, butyl acetate, and methyl ethyl ketone (MEK). These organic solvents may be used singly or in combination of two or more kinds thereof. The solid component concentration in the varnish may be 10% to 80% by mass based on the total mass of the varnish.

The light absorbing layer 32 can be formed by applying the curable resin composition directly on a supporting member 10. In the case of using a varnish of the curable resin composition, which has been diluted with an organic solvent, the light absorbing layer 32 can be formed by applying the curable resin composition on a supporting member 10 and removing the solvent by heating and drying.

The thickness of another embodiment of the light absorbing layer 32 may be 1 to 5000 nm (0.001 to 5 μm) or 50 to 3000 nm (0.05 to 3 μm), from the viewpoint of light detachability.

Subsequently, a resin layer 34 is formed on the light absorbing layer 32.

The resin layer 34 is a layer that does not contain electroconductive particles and is a layer that includes a curable resin component that is cured by heat or light. The resin layer 34 may also be a layer formed from a curable resin component. The curable resin component is not particularly limited; however, for example, those mentioned above as examples of the curable resin component according to the first embodiment of the temporary fixation material precursor layer may be used. The resin layer 34 can be formed from a curable resin component (curable resin composition that does not include electroconductive particles). The curable resin component may be used as a varnish of the curable resin component, which has been diluted with a solvent. The solid component concentration in the varnish may be 10% to 80% by mass based on the total mass of the varnish.

The resin layer 34 can be formed by applying the curable resin component directly on the light absorbing layer 32. In the case of using a varnish of the curable resin component, which has been diluted with a solvent, the resin layer 34 can be formed by applying the curable resin component on the light absorbing layer 32 and removing the solvent by heating and drying. Furthermore, the resin layer 34 can also be formed by producing a curable resin component film formed from the curable resin component.

The thickness of the resin layer 34 may be 0.1 to 2000 μm (0.0001 to 2 mm) or 10 to 150 μm, from the viewpoint of stress relaxation.

The temporary fixation material precursor layer 30 can also be produced by producing in advance a laminated film having a light absorbing layer 32 and a resin layer 34 (hereinafter, may also be referred to as "laminated film for a temporary fixation material") and laminating this such that the light absorbing layer 32 and the supporting member 10 come into contact.

Regarding the configuration of the light absorbing layer 32 and the resin layer 34 in the laminated film for a temporary fixation material, the configuration is not particularly limited as long as the configuration has a light absorbing layer 32 and a resin layer 34; however, for example, a configuration having a light absorbing layer 32 and a resin layer 34, a configuration having a light absorbing layer 32, a resin layer 34, and a light absorbing layer 32 in this order, and the like may be mentioned. Among these, the laminated film for a temporary fixation material may have a configuration having a light absorbing layer 32 and a resin layer 34. The light absorbing layer 32 may be a layer formed from a conductor (conductor layer), or may be a layer containing electroconductive particles. The laminated film for a temporary fixation material may be provided on the supporting film, or may have a protective film provided on the surface on the opposite side of the supporting film, if necessary.

The thickness of the light absorbing layer 32 in the laminated film for a temporary fixation material may be 1 to 5000 nm (0.001 to 5 μm) or 50 to 3000 nm (0.05 to 3 μm), from the viewpoint of light detachability.

The thickness of the resin layer 34 in the laminated film for a temporary fixation material may be 0.1 to 2000 μm (0.0001 to 2 mm) or 10 to 150 μm, from the viewpoint of stress relaxation.

The thickness of the laminated film for a temporary fixation material can be adjusted in accordance with the desired thickness of the temporary fixation material layer. The thickness of the laminated film for a temporary fixation material may be 0.1 to 2000 μm (0.0001 to 2 mm) or 10 to 150 μm, from the viewpoint of stress relaxation.

the temporary fixation material precursor layer 30 having the configuration illustrated in FIG. 5(*b*) can be produced by, for example, forming a resin layer 34 on a supporting member 10 and subsequently forming a light absorbing layer 32. The temporary fixation material precursor layer 30 having the configuration illustrated in FIG. 5(*c*) can be produced by, for example, alternately forming a light absorbing layer 32, a resin layer 34, and a light absorbing layer 32 on a supporting member 10. Such a temporary fixation material precursor layer 30 may also be produced by producing in advance a laminated film for a temporary fixation material layer having the above-described configuration and laminating the laminated film with a supporting member 10.

Figure 6:
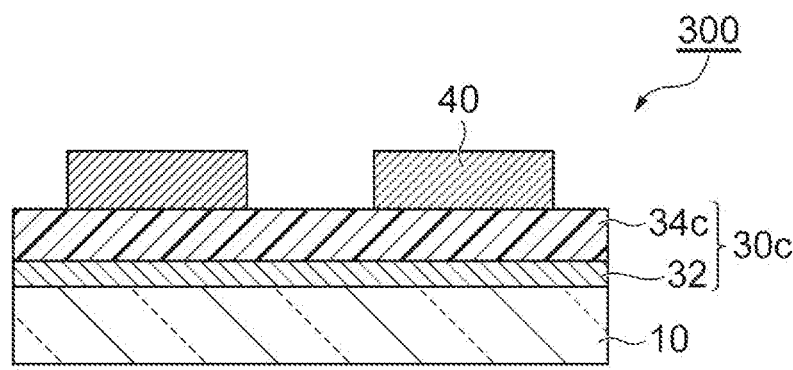
FIGS. 6(a), 6(b), 6(c), and 6(d) are schematic cross-sectional views illustrating an embodiment of a laminated body formed using the temporary fixation material precursor layer illustrated in FIG. 5(a).
Figure 6:
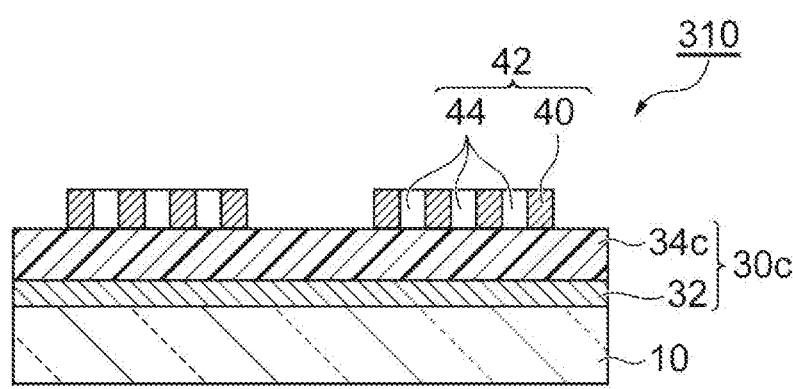
Figure 6:
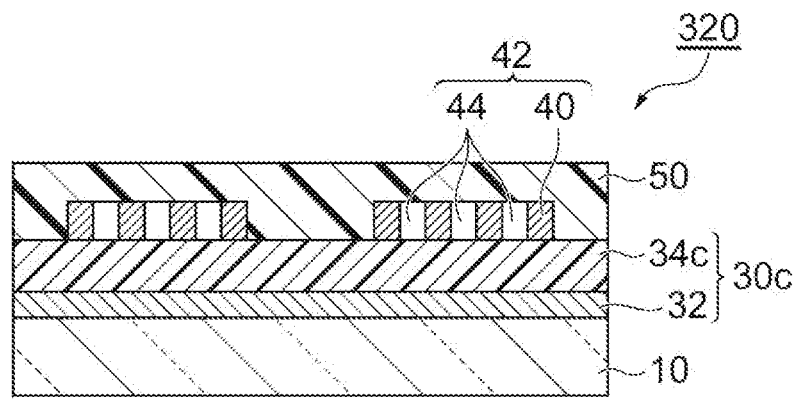
Figure 6:
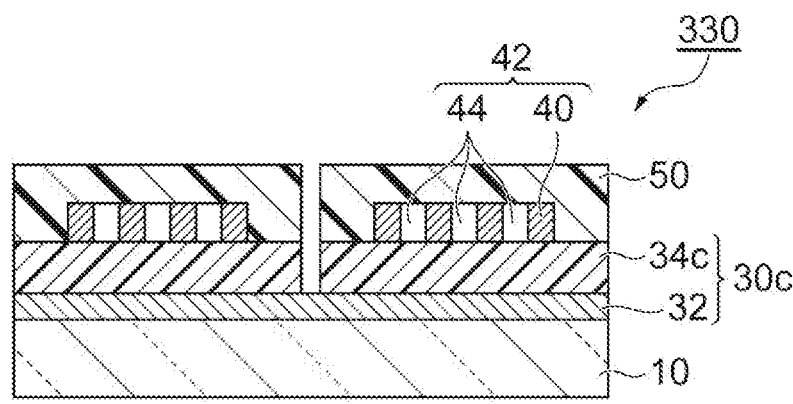

Subsequently, a semiconductor member is disposed on the temporary fixation material precursor layer thus produced, the curable resin component in the temporary fixation material precursor layer is cured, a temporary fixation material layer containing a cured product of a curable resin composition including electroconductive particles, or a temporary fixation material layer having a light absorbing layer and a resin cured product layer including a cured product of a curable resin component is formed, and thereby a laminated body in which a supporting member 10, a temporary fixation material layer 20c or 30c, and a semiconductor member 40 are laminated in this order is produced (FIG. 1(*a*)). FIGS. 3(*a*), 3(*b*), 3(*c*), and 3(*d*) are schematic cross-sectional views illustrating an embodiment of a laminated body formed using the temporary fixation material precursor layer illustrated in FIG. 2. FIGS. 6(*a*), 6(*b*), 6(*c*), and 6(*d*) are schematic cross-sectional views illustrating an embodiment of the laminated body formed using a temporary fixation material precursor layer illustrated in FIG. 5(*a*).

The semiconductor member 40 may be a semiconductor wafer or a semiconductor chip obtained by cutting a semiconductor wafer into a predetermined size and individualizing the semiconductor wafer into a chip form. In the case of using a semiconductor chip as the semiconductor member 40, usually, a plurality of semiconductor chips is used. The thickness of the semiconductor member 40 may be 1 to 1000 μm, 10 to 500 μm, or 20 to 200 μm, from the viewpoints of size reduction and thickness reduction of the semiconductor device, as well as suppression of cracking upon conveying, during the processing process, and the like. The semiconductor wafer or the semiconductor chip may be equipped with a rewiring layer, a pattern layer, or an external connection member having an external connection terminal.

The supporting member 10 provided with the temporary fixation material precursor layer 20 or 30 thus produced is installed on a vacuum press machine or a vacuum laminator, and the semiconductor member 40 can be disposed by compressing with a press.

In the case of using a vacuum press machine, for example, the semiconductor member 40 is compressed onto the temporary fixation material precursor layer 20 or 30 at an air pressure of 1 hPa or less, a compression pressure of 1 MPa, a compression temperature of 120° C. to 200° C., and a retention time of 100 to 300 seconds.

In the case of using a vacuum laminator, for example, the semiconductor member 40 is compressed onto the temporary fixation material precursor layer 20 or 30 at an air pressure of 1 hPa or less, a compression temperature of 60° C. to 180° C. or 80° C. to 150° C., a lamination pressure of 0.01 to 0.5 MPa or 0.1 to 0.5 MPa, and a retention time of 1 to 600 seconds or 30 to 300 seconds.

After the semiconductor member 40 is disposed on the supporting member 10, with the temporary fixation material precursor layer 20 or 30 interposed therebetween, the curable resin component in the temporary fixation material precursor layer 20 or 30 is thermally cured or photocured under predetermined conditions. The conditions for thermal curing may be, for example, 300° C. to lower or 100° C. to 200° C. for 1 to 180 minutes or for 1 to 60 minutes. As such, a cured product of the curable resin component is formed, the semiconductor member 40 is temporary fixed to the supporting member 10, with a temporary fixation material layer 20c or 30c including a cured product of the curable resin component interposed therebetween, and thus a laminated body 200 or 300 is obtained. The temporary fixation material layer 20c can be configured to include, as illustrated in FIG. 3(*a*), electroconductive particles 22 and a cured product 24c of the curable resin component. The temporary fixation material layer 30c can be configured to include, as illustrated in FIG. 6(*a*), a light absorbing layer 32 and a resin cured product layer 34c including a cured product of the curable resin component.

Figure 8:
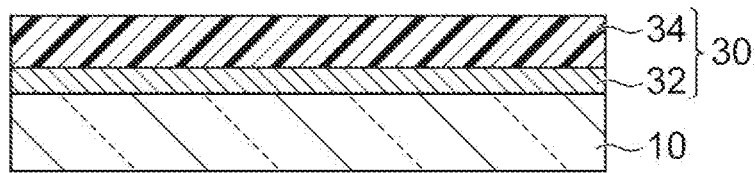
FIG. 8 is a schematic cross-sectional view for describing another embodiment of a method for producing the laminated body illustrated in FIG. 1(a), and FIGS. 8(a), 8(b), and 8(c) are schematic cross-sectional views illustrating the various steps.
Figure 8:
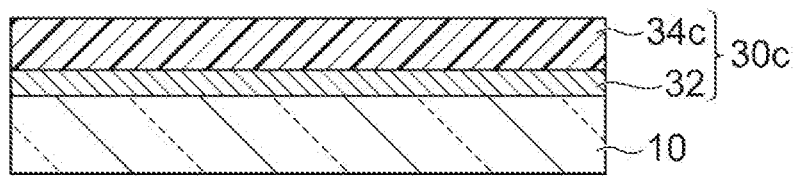
Figure 8:
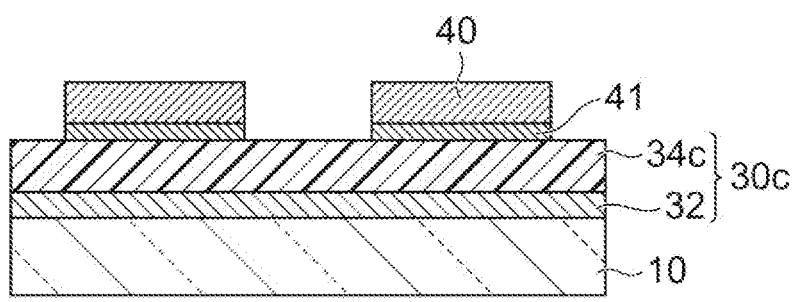

The laminated body can also be produced by, for example, forming a temporary fixation material layer and then disposing a semiconductor member. FIG. 8 is a schematic cross-sectional view for describing another embodiment of the method for producing a laminated body illustrated in FIG. 1(*a*), and FIGS. 8(*a*), 8(*b*), and 8(*c*) are schematic cross-sectional views illustrating the various steps. The various steps of FIG. 8 use the temporary fixation material precursor layer illustrated in FIG. 5(*a*). A laminated body can be produced by forming a temporary fixation material precursor layer 30 including a curable resin component on a supporting member 10 (FIG. 8(*a*)), curing the curable resin component in the temporary fixation material precursor layer 30, forming a temporary fixation material layer 30c including a cured product of the curable resin component (FIG. 8(*b*)), and disposing a semiconductor member 40 on the temporary fixation material layer 30c thus formed (FIG. 8(*c*)). In such a production method, since a wiring layer 41 such as a rewiring layer or a pattern layer can be provided on the temporary fixation material layer 30c before the semiconductor member 40 is disposed, a semiconductor member 40 having the wiring layer 41 can be formed by disposing the semiconductor member 40 on the wiring layer 41.

The semiconductor member 40 (semiconductor member 40 temporarily fixed to the supporting member 10) in the laminated body 100 may be further processed. By processing the semiconductor member 40 in the laminated body 200 illustrated in FIG. 3(*a*), laminated bodies 210 (FIG. 3(*b*)), 220 (FIG. 3(*c*)), 230 (FIG. 3(*d*)), and the like are obtained. By processing the semiconductor member 40 in the laminated body 300 illustrated in FIG. 6(*a*), laminated bodies 310 (FIG. 6(*b*)), 320 (FIG. 6(*c*)), 330 (FIG. 6(*d*)), and the like are obtained. Processing of the semiconductor member is not particularly limited; however, thinning of the semiconductor member, production of a penetrating electrode, formation of a penetration electrode, formation of a wiring layer such as a rewiring layer or a pattern layer, an etching treatment, a plating reflow treatment, a sputtering treatment, and the like may be mentioned.

Thinning of the semiconductor member can be carried out by grinding a surface of the semiconductor member 40, the surface being on the opposite side of the surface that is in contact with the temporary fixation material layer 20c or 30c, using a grinder or the like. The thickness of the thinned semiconductor member may be, for example, 100 μm or less.

The grinding conditions can be arbitrarily set according to the desired thickness of the semiconductor member, the grinding state, and the like.

The production of a penetration electrode can be carried out by performing processing such as dry ion etching or a Bosch process on a surface of the thinned semiconductor member 40, the surface being on the opposite side of the surface that is in contact with the temporary fixation material layer 20c or 30c, forming through-holes, and then subjecting the semiconductor member 40 to a treatment such as copper plating.

In this way, the semiconductor member 40 is subjected to processing, for example, the semiconductor member 40 is thinned, and a laminated body 210 (FIG. 3(*b*)) or a laminated body 310 (FIG. 6(*b*)), both having a penetration electrode 44 provided therein, can be obtained.

The laminated body 210 illustrated in FIG. 3(*b*) and the laminated body 310 illustrated in FIG. 6(*b*) may be covered with a sealing layer 50 as illustrated in FIG. 3(*c*) and FIG. 6(*c*). There are no particular limitations on the material for the sealing layer 50; however, from the viewpoints of heat resistance as well as reliability, and the like, the material may be a thermosetting resin composition. Examples of a thermosetting resin to be used for the sealing layer 50 include epoxy resins such as a cresol novolac epoxy resin, a phenol novolac epoxy resin, a biphenyl diepoxy resin, and a naphthol novolac epoxy resin. In the composition for forming the sealing layer 50, additives such as a filler and/or a flame-retardant substance such as a bromine compound may be added thereto.

The supply form of the sealing layer 50 is not particularly limited; however, the supply form may be a solid material, a liquid material, a fine granular material, a film material, or the like.

For the sealing of the processed semiconductor member 42 by means of a sealing layer 50 formed from a sealing film, for example, a compression sealing molding machine, a vacuum lamination apparatus, or the like is used. A sealing layer 50 can be formed using the above-described apparatus, for example, by covering the processed semiconductor member 42 with a sealing film that has been heat-melted under the conditions of 40° C. to 180° C. (or 60° C. to 150° C.), 0.1 to 10 MPa (or 0.5 to 8 MPa), and 0.5 to 10 minutes. The sealing film may be prepared in a state of being laminated on a release liner such as a polyethylene terephthalate (PET) film. In this case, the sealing film is disposed on the processed semiconductor member 42, the processed semiconductor member 42 is embedded therein, subsequently the release liner is peeled off, and thereby the sealing layer 50 can be formed. In this way, the laminated body 220 illustrated in FIG. 3(c) or the laminated body 320 illustrated in FIG. 6(c) can be obtained.

The thickness of the sealing film is adjusted such that the sealing layer 50 is thicker than or equal to the thickness of the processed semiconductor member 42. The thickness of the sealing film may be 50 to 2000 μm, 70 to 1,500 μm, or 100 to 1000 μm.

Figure 3A:
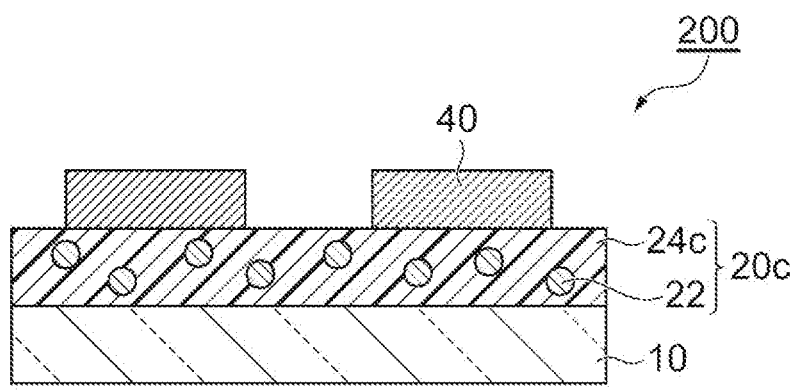
FIGS. 3(a), 3(b), 3(c), and 3(d) are schematic cross-sectional views illustrating an embodiment of a laminated body formed using the temporary fixation material precursor layer illustrated in FIG. 2.
Figure 3B:
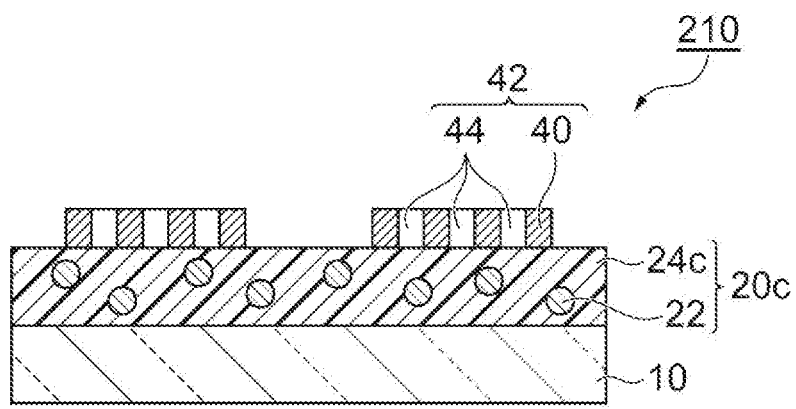
Figure 3C:
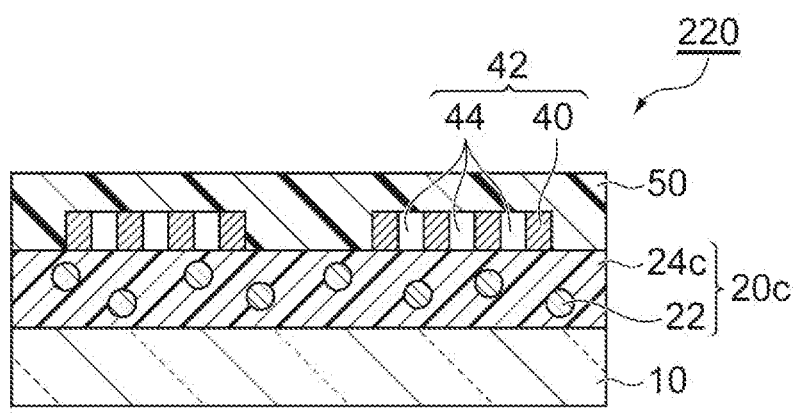
Figure 3D:
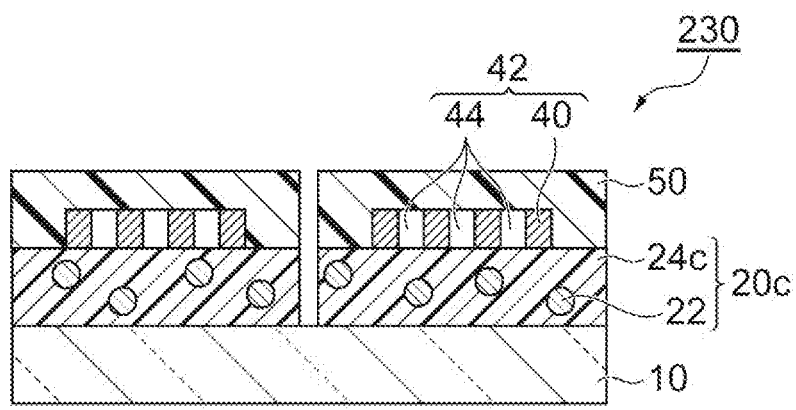

The processed semiconductor member 42 having the sealing layer 50 may be individualized by dicing, as illustrated in FIG. 3(d) and FIG. 6(d). In this way, the laminated body 230 illustrated in FIG. 3(d) or the laminated body 330 illustrated in FIG. 6(d) can be obtained. Meanwhile, individualization by dicing may be carried out after the separation step for the semiconductor member that will be described below.

<Separation Step for Semiconductor Member>

As illustrated in FIG. 1(b), in the separation step for the semiconductor member, the temporary fixation material layer 20c or 30c in the laminated body 100 is irradiated with incoherent light, and then the semiconductor member 40 is separated from the supporting member 10.

Figure 4A:
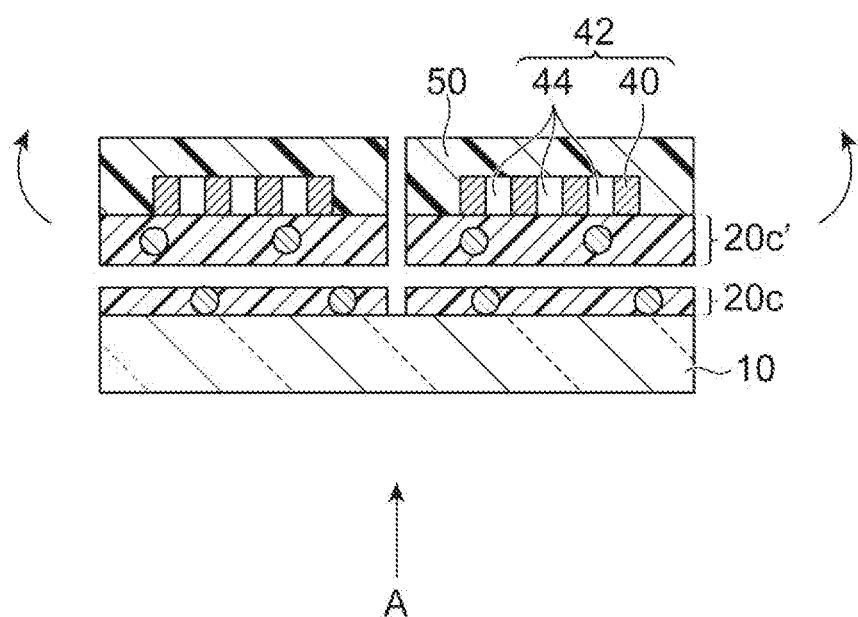
FIG. 4 is a schematic cross-sectional view for describing an embodiment of the semiconductor device manufacturing method of the present invention using the laminated body illustrated in FIG. 3(d), and FIGS. 4(a) and 4(b) are schematic cross-sectional views illustrating the various steps.
Figure 4B:
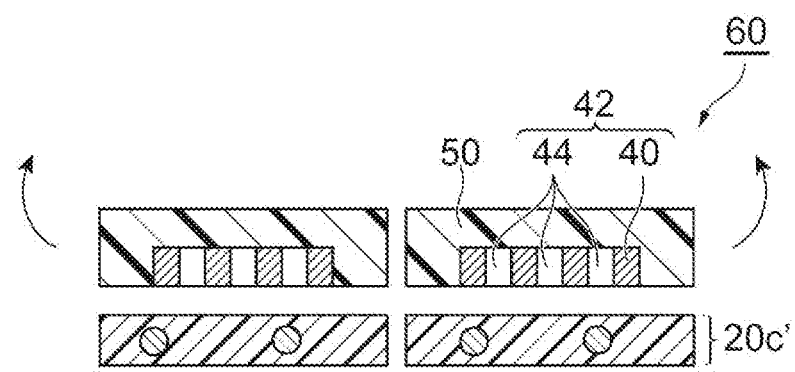
Figure 7A:
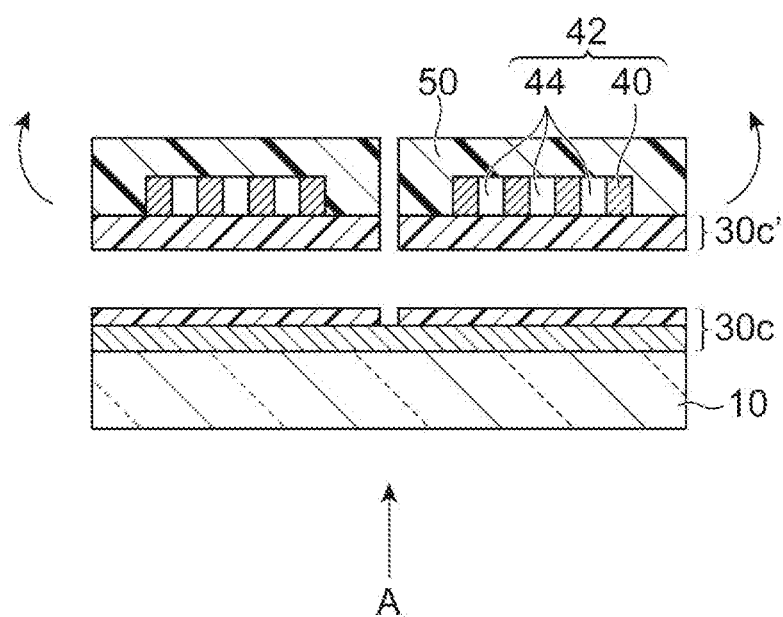
FIG. 7 is a schematic cross-sectional view for describing an embodiment of the semiconductor device manufacturing method of the present invention using the laminated body illustrated in FIG. 6(d), and FIGS. 7(a) and 7(b) are schematic cross-sectional views illustrating the various steps.
Figure 7B:
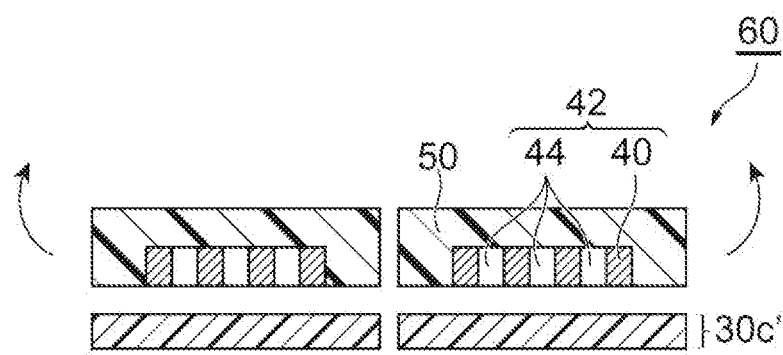

FIG. 4 is a schematic cross-sectional view for describing an embodiment of the semiconductor device manufacturing method of the present invention using the laminated body illustrated in FIG. 3(d), and FIGS. 4(a) and 4(b) are schematic cross-sectional views illustrating the various steps. FIG. 7 is a schematic cross-sectional view for describing an embodiment of the semiconductor device manufacturing method of the present invention using the laminated body illustrated in FIG. 6(d), and FIGS. 7(a) and 7(b) are schematic cross-sectional views illustrating the various steps.

When the temporary fixation material layer 20c or 30c is irradiated with incoherent light, the electroconductive particles 22 or the light absorbing layer 32 absorbs light and instantaneously generates heat, and at the interface or in the bulk, melting of the cured product 24c of the curable resin component or the resin cured product layer 34c caused by heat, stress between the supporting member 10 and the semiconductor member 40 (processed semiconductor member 42), scattering of the electroconductive particles 22 or the light absorbing layer 32, and the like can occur. As a result of the occurrence of such phenomena, the processed semiconductor member 42 that is temporarily fixed can be easily separated (detached) from the supporting member 10. Meanwhile, in the separation step, together with irradiation with incoherent light, stress may be slightly exerted to the processed semiconductor member 42 in a direction parallel to the principal plane of the supporting member 10.

Incoherent light is electromagnetic waves having properties that interference fringes are not generated, coherence is low, and directivity is low, and as the optical path length is longer, the incoherent light tends to be attenuated. Incoherent light is a light that is not coherent light. While laser light is generally coherent light, light such as sunlight or fluorescent lamp light is incoherent light. Incoherent light can be said to be light except for laser light. Since the irradiation area of the incoherent light is overwhelmingly larger than coherent light (that is, laser light), it is possible to reduce the number of times of irradiation (for example, once).

The incoherent light in the separation step may be light including at least infrared light. The light source for the incoherent light in the separation step is not particularly limited; however, the light source may be a xenon lamp. A xenon lamp is a lamp that utilizes light emission caused by application and discharge in an arc tube having xenon gas enclosed therein. Since a xenon lamp is discharged while ionization and excitation are repeated, the xenon lamp stably has continuous wavelengths from the ultraviolet light region to the infrared light region. In a xenon lamp, since the time required for starting is short compared to lamps such as a metal halide lamp, the time related to the process can be shortened to a large extent. Furthermore, regarding light emission, since it is necessary to apply a high voltage, high heat is instantaneously generated; however, the cooling time is short, and a continuous operation is enabled. Furthermore, since the irradiation area of a xenon lamp is overwhelmingly large compared to a laser, it is possible to reduce the number of times of irradiation (for example, once).

Regarding the conditions for irradiation by a xenon lamp, the voltage to be applied, the pulse width, the irradiation time, the irradiation distance (distance between the light source and the temporary fixation material layer), the irradiation energy, and the like can be arbitrarily set up. Regarding the conditions for irradiation by a xenon lamp, conditions in which separation is enabled by irradiation for once may be set up, or conditions in which separation is enabled by irradiation for two or more times may be set up; however, from the viewpoint of reducing damage to the processed semiconductor member 42, regarding the conditions for irradiation by a xenon lamp, conditions in which separation is enabled by irradiation for once may be set up.

The separation step may be a step of irradiation the temporary fixation material layer 20c or 30c with incoherent light through the supporting member 10 (direction A in FIG. 4(a) and FIG. 7(a)), that is, the irradiation of the temporary fixation material layer 20c or 30c with incoherent light may be irradiation through the supporting member 10 side. By irradiating the temporary fixation material layer 20c or 30c with incoherent light through the supporting member 10, it is possible to irradiate the entirety of the temporary fixation material layer 20c or the entirety of the temporary fixation material layer 30c.

When the semiconductor member 40 or the processed semiconductor member 42 is separated from the supporting member 10, in a case in which residue 20c' (FIGS. 4(a) and (b)) or 30c' (FIGS. 7(a) and 7(b)) of the temporary fixation material layer is adhering to the semiconductor member 40 or the processed semiconductor member 42, these can be washed with a solvent. The solvent is not particularly limited; however, examples include ethanol, methanol, toluene, xylene, acetone, methyl ethyl ketone, methyl isobutyl ketone, hexane, and the like. These may be used singly or in combination of two or more kinds thereof. Furthermore, the semiconductor member 40 or the processed semiconductor member 42 may be immersed in these solvents, or may be subjected to ultrasonic cleaning. Furthermore, the member may also be heated in the range of 100° C. or lower.

By separating the semiconductor member from the supporting member as such, a semiconductor element 60 including the semiconductor member 40 or the processed semiconductor member 42 is obtained (FIG. 4(b) and FIG. 7(b)). A semiconductor device can be produced by connecting the semiconductor element 60 thus obtained to another semiconductor element or a substrate for mounting semiconductor elements.

[Curable Resin Composition for Temporary Fixation Material]

The above-mentioned curable resin composition including electroconductive particles that generate heat upon absorbing light can be suitably used as a temporary fixation material for temporarily fixing a semiconductor member to a supporting member.

The content of the electroconductive particles may be 30 to 90 parts by mass with respect to a total amount of 100 parts by mass of the components other than the electroconductive particles in the curable resin composition. Meanwhile, the components other than the electroconductive particles in the curable resin composition do not include a solvent. The content of the electroconductive particles may be 35 parts by mass or more, 40 parts by mass or more, or 45 parts by mass or more. The content of the electroconductive particles may be 80 parts by mass or less, 70 parts by mass or less, or 60 parts by mass or less.

The curable resin composition may further include a thermoplastic resin. The content of the thermoplastic resin may be 10 to 90 parts by mass with respect to a total amount of 100 parts by mass of the components other than the electroconductive particles in the curable resin composition. The content of the thermoplastic resin may be 30 parts by mass or more, 50 parts by mass or more, or 70 parts by mass or more. The content of the thermoplastic resin may be 88 parts by mass or less, 85 parts by mass or less, or 82 parts by mass or less.

The curable resin composition may further include a polymerizable monomer and a polymerization initiator. The content of the polymerizable monomer may be 10 to 90 parts by mass with respect to a total amount of 100 parts by mass of the components other than the electroconductive particles in the curable resin composition. The content of the polymerizable monomer may be 12 parts by mass or more, 15 parts by mass or more, or 18 parts by mass or more. The content of the polymerizable monomer may be 70 parts by mass or less, 50 parts by mass or less, or 30 parts by mass or less. The content of the polymerization initiator may be 0.01 to 5 parts by mass with respect to a total amount of 100 parts by mass or the polymerizable monomer. The content of the polymerization initiator may be 0.03 parts by mass or more or 0.05 parts by mass or more. The content of the polymerization initiator may be 3 parts by mass or less, 1 part by mass or less, or 0.1 parts by mass or less.

The curable resin composition may be formed into a film form.

[Film for Temporary Fixation Material]

A film including the above-mentioned curable resin composition for a temporary fixation material can be suitably used as a temporary fixation material for temporarily fixing a semiconductor member to a supporting member.

[Laminated Film for Temporary Fixation Material]

A laminated film having a resin layer including the above-mentioned light absorbing layer and the resin layer including a curable resin component can be suitably used as a temporary fixation material for temporarily fixing a semiconductor member to a supporting member.

EXAMPLES

Hereinafter, the present invention will be more specifically described by way of Examples. However, the present invention is not intended to be limited to these Examples.

Examples 1-1 to 1-4 and Comparative Example 1-1

Production Example 1-1

<Preparation of Curable Resin Composition for Temporary Fixation Material>

80 parts by mass of a hydrogenated styrene-butadiene elastomer (trade name: DYNARON 2324P, JSR Corp., Tg: −50° C.) as a thermoplastic resin, 20 parts by mass of 1,9-nonanediol diacrylate (trade name: FA-129AS, Hitachi Chemical Co., Ltd.) as a polymerizable monomer, and 1 part by mass of a peroxy ester (trade name: PERHEXA 25O, NOF Corp.) as a polymerization initiator were mixed. Meanwhile, the hydrogenated styrene-butadiene elastomer was used after being diluted with toluene to a solid content of 40% by mass. To this, 50 parts by mass of electroconductive particles A (copper powder, trade name: 1300Y, Mitsui Mining & Smelting Co., Ltd., shape: granular shape, average particle size ($D_{50}$): 3.5 μm, tap density: 5.0 g/cm$^3$) was added. A mixture thus obtained was stirred using an automatic stirring apparatus for 10 minutes at a rate of 2,200 rotations/min, and thereby a varnish of a curable resin composition for a temporary fixation material including toluene as a solvent was obtained.

<Production of Film for Temporary Fixation Material>

The varnish of a curable resin composition for a temporary fixation material thus obtained was applied on a mold release-treated surface of a polyethylene terephthalate (PET) film (PUREX A31, DuPont Teijin Films, Ltd., thickness: 38 μm) using a precision coating machine, and the solvent was removed by drying for 10 minutes at 80° C. Thus, a film for a temporary fixation material of Production Example 1-1 having a thickness of about 100 μm was produced.

<Production of Laminated Body (Evaluation Sample)>

The film for a temporary fixation material of Production Example 1-1 produced as described above was cut into a size of 5 mm×5 mm. A slide glass (size: 15 mm×20 mm, thickness: 1 mm) as a supporting member and a silicon wafer (size: 8 mm×10 mm, thickness: 750 μm) as a semiconductor member were used, the film for a temporary fixation material of Production Example 1-1 was interposed between the silicon wafer and the slide glass, and temporary thermocompression bonding was performed using a thermocompression bonding machine under the conditions of 90° C., 5 seconds, and 1 MPa. Subsequently, a temporary fixation material layer was formed by thermally curing the film in an explosion-proof dryer under the conditions of 150° C. and 1 hour, and thereby a laminated body of Production Example 1-1 was produced.

Production Example 1-2

A film for a temporary fixation material and a laminated body of Production Example 1-2 were produced in the same manner as in Production Example 1-1, except that the electroconductive particles A were changed to electroconductive particles B (silver powder, trade name: K0082P, Metalor, shape: granular shape, average particle size ($D_{50}$): 1.5 μm, tap density: 5.0 g/cm$^3$).

Production Example 1-3

A film for a temporary fixation material and a laminated body of Production Example 1-3 were produced in the same manner as in Production Example 1-1, except that the electroconductive particles A were changed to electroconductive particles C (silver powder, trade name: AgC-239, Fukuda Metal Foil & Powder Co., Ltd., shape: flat shape, average particle size ($D_{50}$): 2.0 to 3.4 μm, tap density: 4.2 to 6.1 g/cm$^3$).

Production Example 1-4

A film for a temporary fixation material and a laminated body of Production Example 1-4 were produced in the same manner as in Production Example 1-1, except that the electroconductive particles A were changed to electroconductive particles D (carbon powder, trade name: MA600, manufactured by Mitsubishi Chemical Corp., shape: granular shape).

Production Example 1-5

A laminated body of Production Example 1-5 was produced in the same manner as in Production Example 1-1, except that the electroconductive particles A were not added.

Examples 1-1 to 1-4 and Comparative Example 1-1

<Detachability Test>

A xenon lamp was used as a light source for incoherent light. The laminated bodies of Production Examples 1-1 to 1-5 were irradiated with the xenon lamp under the irradiation conditions shown in Table 1, and detachability from the supporting member was evaluated. The temporary fixation material layer was irradiated through the supporting member (slide glass) of the laminated body, using S2300 (wavelength range: 270 nm to near-infrared region, irradiation energy per unit area: 17 J/cm$^2$) manufactured by Xenon Corp. as the xenon lamp. The irradiation distance is the distance between the light source and the stage where the slide glass is installed. Regarding the evaluation of the detachability test, a case in which the silicon wafer was spontaneously detached from the slide glass after irradiation by the xenon lamp was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 1.

TABLE 1

| | Laminated body | Applied voltage (V) | Pulse width (μs) | Irradiation distance (mm) | Number of times of irradiation (times) | Irradiation time (μs) | Evaluation |
|---|---|---|---|---|---|---|---|
| Exam. 1-1a | Production Exam. 1-1 | 3000 | 5000 | 10 | 1 | 5000 | A |
| Exam. 1-1b | Exam. 1-1 | | 3000 | | | 3000 | A |
| Exam. 1-2 | Production Exam. 1-2 | | 5000 | | | 5000 | A |
| Exam. 1-3 | Production Exam. 1-3 | | | | | | A |
| Exam. 1-4 | Production Exam. 1-4 | | | | | | A |
| Comp. Exam. 1-1 | Production Exam. 1-5 | | | | | | C |

<Heat Resistance Test>

The laminated bodies of Production Examples 1-1 to 1-5 were heated, and the adhesiveness between the supporting member and the semiconductor member and the detachability from the supporting member after the heating treatment were evaluated as heat resistance. Heating was carried out by leaving the laminated bodies of Production Examples 1-1 to 1-5 to stand on a hot plate heated to 260° C. for one hour. Regarding the adhesiveness after the heating treatment, a case in which when tweezers were inserted between the silicon wafer and the slide glass, the silicon wafer and the slide glass were not separated was rated as "A"; and a case in which the two were separated was rated as "B". The detachability from the slide glass after the heating treatment was evaluated similarly to the above-described detachability test. Irradiation with a xenon lamp was carried out using a xenon lamp similar to that used for the above-described detachability test, at an applied voltage of 3000 V, a pulse width of 5000 μs, an irradiation distance of 10 mm, a number of times of irradiation of one time, and an irradiation time of 5000 μs. The results are presented in Table 2.

TABLE 2

| | Laminated body | Adhesiveness after heating treatment | Detachability after heating treatment |
|---|---|---|---|
| Exam. 1-1 | Production Exam. 1-1 | A | A |
| Exam. 1-2 | Production Exam. 1-2 | A | A |
| Exam. 1-3 | Production Exam. 1-3 | A | A |
| Exam. 1-4 | Production Exam. 1-4 | A | A |
| Comp. Exam. 1-1 | Production Exam. 1-5 | A | C |

From a comparison between Examples 1-1 to 1-4 and Comparative Example 1-1, it was found that Examples 1-1 to 1-4 are superior to Comparative Example 1-1 from the viewpoint of detachability from the supporting member. Furthermore, it was found that the curable resin compositions for temporary fixation of the present invention can form temporary fixation material layers having excellent heat resistance.

Examples 2-1 and 2-2 and Comparative Example 2-1

Production Example 2-1

<Preparation of Curable Resin Component>

80 parts by mass of a hydrogenated styrene-butadiene elastomer (trade name: DYNARON 2324P, JSR Corp.) as a thermoplastic resin, 20 parts by mass of 1,9-nonanediol diacrylate (trade name: FA-129AS, Hitachi Chemical Co., Ltd.) as a polymerizable monomer, and 1 part by mass of a peroxy ester (trade name: PERHEXA 250, NOF Corp.) as a polymerization initiator were mixed. Meanwhile, the hydrogenated styrene-butadiene elastomer was used after being diluted with toluene to a solid content of 40% by mass. In this way, a varnish of the curable resin component including toluene as a solvent was prepared.

<Preparation of Curable Resin Composition>

14 parts by mass of an epoxy resin (trade name: EPI-CLON EXA-4816, DIC Corp.), 1 part by mass of a curing agent (trade name: CUREZOL 1B2MZ, Shikoku Chemicals Corp.), 60 parts by mass of electroconductive particles E (silver-coated copper powder, trade name: Ag1400VP, Mitsui Mining & Smelting Co., Ltd., shape: flat shape), and 25 parts by mass of an organic solvent (ethyl acetate) were mixed, and thereby a varnish of a curable resin composition was prepared.

<Production of Laminated Film for Temporary Fixation Material>

The varnish of the curable resin component thus obtained was applied on a mold release-treated surface of a polyethylene terephthalate (PET) film (PUREX A31, DuPont Teijin Films, Ltd., thickness: 38 μm) using a precision coating machine, the solvent was removed by drying for 10 minutes at 80° C., and a resin layer having a thickness of about 100 μm was produced.

Next, the varnish of the curable resin composition was applied on the resin layer using a precision coating machine, the organic solvent was removed by drying for 10 minutes at 80° C., and thereby a light absorbing layer having a thickness of 1000 nm was produced. Thereby, a laminated film for a temporary fixation material of Production Example 2-1 having a thickness of about 100 μm was obtained.

<Production of Laminated Body (Evaluation Sample)>

The laminated film for a temporary fixation material of Production Example 2-1 produced as described above was cut into a size of 5 mm×5 mm. A slide glass (size: 20 mm×15 mm, thickness: 1 mm) as a supporting member and a silicon wafer (size: 8 mm×10 mm, thickness: 750 μm) as a semiconductor member were used, the laminated film for a temporary fixation material of Production Example 2-1 was interposed between the silicon wafer and the slide glass such that the light absorbing layer came into contact with the slide glass (configuration illustrated in FIG. 5(a)), and temporary thermocompression bonding was carried out using a thermocompression bonding machine under the conditions of 90° C., 5 seconds, and 1 MPa. Subsequently, the resultant was thermally cured in an explosion-proof dryer under the conditions of 150° C. and 1 hour, and thereby a laminated body of Production Example 2-1 was produced.

Production Example 2-2

A laminated film for a temporary fixation material and a laminated body of Production Example 2-2 were obtained in the same manner as in Production Example 2-1, except that the light absorbing layer was changed to a layer configured to include two conductor layers (first conductor layer: titanium, second conductor layer: copper). Meanwhile, this light absorbing layer was subjected to a preliminary treatment by back sputtering (Ar flow rate: 1.2×10−2 Pa·m$^3$/s (70 sccm), RF power: 300 W, time: 300 seconds) and then to RF sputtering under the treatment conditions shown in Table 3, and the thicknesses of titanium (first conductor layer)/copper (second conductor layer) were adjusted to 50 nm/200 nm.

TABLE 3

| Sputtering treatment | Ar flow rate | Power |
|---|---|---|
| Treatment 1: Production of first conductor layer (titanium) | 1.2 × 10$^{-2}$ Pa · m$^3$/s (70 sccm) | 2000 W |
| Treatment 2: Production of second conductor layer (copper) | 1.2 × 10$^{-2}$ Pa · m$^3$/s (70 sccm) | 2000 W |

Production Example 2-3

A laminated body of Production Example 2-3 was produced in the same manner as in Production Example 2-1, except that a light absorbing layer was not provided (that is, including a resin layer only).

Examples 2-1 and 2-2 and Comparative Example 2-1

<Detachability Test>

A xenon lamp was used as a light source for incoherent light. The laminated bodies of Production Examples 2-1 to 2-3 were irradiated with the xenon lamp under the irradiation conditions shown in Table 4, and detachability from the supporting member was evaluated. The temporary fixation material layer was irradiated through the supporting member (slide glass) of the laminated body, using S2300 (wavelength range: 270 nm to near-infrared region, irradiation energy per unit area: 17 J/cm$^2$) manufactured by Xenon Corp. as the xenon lamp. The irradiation distance is the distance between the light source and the stage where the slide glass is installed. Regarding the evaluation of the detachability test, a case in which the silicon wafer was spontaneously detached from the slide glass after irradiation by the xenon lamp was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 4.

TABLE 4

| Laminated body | Applied voltage (V) | Pulse width (µs) | Irradiation distance (mm) | Number of times of irradiation (times) | Irradiation time (µs) | Evaluation |
|---|---|---|---|---|---|---|
| Exam. 2-1a | Production Exam. 2-1 | 3000 | 5000 | 10 | 1 | 5000 | A |
| Exam. 2-1b | Production Exam. 2-1 | | 3000 | | | 3000 | A |
| Exam. 2-2 | Production Exam. 2-2 | | 5000 | | | 5000 | A |
| Comp. Exam. 2-1 | Production Exam. 2-3 | | | | | | C |

From a comparison between Examples 2-1 and 2-2 and Comparative Example 2-1, it was found that Examples 2-1 and 2-2 were superior to Comparative Example 2-1 from the viewpoint of detachability from the supporting member.

Examples 3-1 to 3-3 and Comparative Examples 3-1 to 3-3

Production Example 3-1

<Production of Evaluation Sample>
The laminated film for a temporary fixation material of Example 2-2 produced as described above was cut into a size of 5 mm×5 mm. A slide glass (size: 20 mm×15 mm, thickness: 1 mm) as a supporting member and a silicon wafer (size: 8 mm×10 mm, thickness: 750 µm) as a semiconductor member were used, the laminated film for a temporary fixation material of Example 2-2 was interposed between the silicon wafer and the slide glass such that the light absorbing layer came into contact with the slide glass (configuration illustrated in FIG. 5(a)), and temporary thermocompression bonding was carried out using a thermocompression bonding machine under the conditions of 90° C., 5 seconds, and 1 MPa. Subsequently, the resultant was thermally cured in an explosion-proof dryer under the conditions of 150° C. and 1 hour, and thereby a laminated body of Production Example 3-1 was produced.

Production Example 3-2

A laminated body of Production Example 3-2 was produced in the same manner as in Production Example 3-1, except that the laminated film for a temporary fixation material of Example 2-2 was inserted between the silicon wafer and the slide glass such that the light absorbing layer comes into contact with the silicon wafer (so as to obtain the configuration illustrated in FIG. 5(b)).

Production Example 3-3

On the surface of the laminated film for a temporary fixation material of Example 2-2 where no light absorbing layer was provided, a second light absorbing layer (copper) and a first light absorbing layer (titanium) were further laminated in this order, and thereby a laminated film for a temporary fixation material was produced. Meanwhile, this light absorbing layer was subjected to a preliminary treatment by back sputtering (Ar flow rate: $1.2 \times 10^{-2}$ Pa·m$^3$/s (70 sccm), RF power: 300 W, time: 300 seconds) similarly to Example 2-2, and then RF sputtering was performed under the treatment conditions shown in Table 3. The thicknesses of titanium/copper were adjusted to 50 nm/200 nm. A laminated body of Production Example 3-3 was produced in the same manner as in Production Example 3-1, except that the laminated film for a temporary fixation material produced as such was interposed between the silicon wafer and the slide glass so as to obtain the configuration illustrated in FIG. 5(c).

Examples 3-1 to 3-3

<Detachability Test>
A xenon lamp was used as a light source for incoherent light. The laminated bodies of Production Examples 3-1 to 3-3 were irradiated with the xenon lamp under the irradiation conditions shown in Table 5, and detachability from the supporting member was evaluated. The temporary fixation material layer was irradiated through the supporting member (slide glass) of the laminated body, using S2300 (wavelength range: 270 nm to near-infrared region, irradiation energy per unit area: 17 J/cm$^2$) manufactured by Xenon Corp. as the xenon lamp. The irradiation distance is the distance between the light source and the stage where the slide glass is installed. Regarding the evaluation of the detachability test, a case in which the silicon wafer was spontaneously detached from the slide glass after irradiation by the xenon lamp was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 5.

TABLE 5

| Laminated body | Applied voltage (V) | Pulse width (µs) | Irradiation distance (mm) | Number of times of irradiation (times) | Irradiation time (µs) | Evaluation |
|---|---|---|---|---|---|---|
| Exam. 3-1 | Production Exam. 3-1 | 3000 | 5000 | 10 | 1 | 5000 | A |
| Exam. 3-2 | Production Exam. 3-2 | | | | | | A |
| Exam. 3-3 | Production Exam. 3-3 | | | | | | A |

Comparative Examples 3-1 to 3-3

<Detachability Test>
A YAG laser was used as a light source for coherent light. The laminated bodies of Production Examples 3-1 to 3-3 were irradiated with YAG laser light, and detachability from the supporting member was evaluated. The temporary fixation material layer was irradiated through the supporting member (slide glass) of the laminated body, using MD-H (wavelength: 1,064 nm, power output: 10 W, scan rate: 1000 mm/s) manufactured by Keyence Corp. as the YAG laser. Regarding the evaluation of the detachability test, a case in which the silicon wafer was spontaneously detached from the slide glass after irradiation by the YAG laser was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 6.

TABLE 6

|  | Laminated body | Evaluation |
| --- | --- | --- |
| Comp. Exam. 3-1 | Production Exam. 3-1 | C |
| Comp. Exam. 3-2 | Production Exam. 3-2 | C |
| Comp. Exam. 3-3 | Production Exam. 3-3 | C |

From a comparison between Examples 3-1 to 3-3 and Comparative Examples 3-1 to 3-3, it was found that Examples 3-1 to 3-3 in which a xenon lamp giving incoherent light was used are superior to Comparative Examples 3-1 to 3-3 in which a YAG laser giving coherent light, from the viewpoint of detachability.

Examples 4-1 to 4-6

Production Examples 4-1 to 4-6

<Preparation of Curable Resin Component>
70 parts by mass of a hydrogenated styrene-based elastomer (trade name: FG1924, Kraton Polymers Japan, Ltd.) as a thermoplastic resin, 30 parts by mass of a dicyclopentadiene type epoxy resin (trade name: HP-7200H, DIC Corp.) as an epoxy resin, and 2 parts by mass of 1-cyanoethyl-2-phenylimidazole (trade name: CUREZOL 2PZ-CN, Shikoku Chemicals Corp.) as a curing accelerator were mixed. Meanwhile, the hydrogenated styrene-based elastomer was used after being diluted with toluene to a solid content of 25% by mass, and the epoxy resin was used after being diluted with toluene to a solid content of 50% by mass. Mixing was performed using a mix rotor, the mixture was stirred for 24 hours at a rate of 50 rotations/min, and thereby a varnish of the curable resin component including toluene as a solvent was prepared.

<Production of Curable Resin Component Film>
The varnish of the curable resin component thus obtained was applied on a mold release-treated surface of a polyethylene terephthalate (PET) film (PUREX A31, DuPont Teijin Films, Ltd., thickness: 38 μm) using a precision coating machine, the solvent was removed by drying for 10 minutes at 80° C., and thus a curable resin component film (resin layer) having a thickness of about 20 μm was produced.

<Production of Laminated Body (Evaluation Sample)>
A slide glass (size: 20 mm×15 mm, thickness: 1 mm) was prepared as a supporting member, a conductor layer having the metal species and thickness shown in Table 7 was produced using a metal vapor deposition apparatus, and this was used as a light absorbing layer. Meanwhile, in the light absorbing layer, the supporting member, the first conductor layer, and the second conductor layer were laminated in this order. Next, the above-mentioned curable resin component film was cut into a size of 50 mm×50 mm, and a silicon wafer (size: 8 mm×10 mm, thickness: 750 μm) was prepared as a semiconductor member. The curable resin component film thus cut was interposed between the light absorbing layer and the slide glass so as to obtain the configuration illustrated in FIG. 5(a), and temporary thermocompression bonding was performed using a thermocompression bonding machine under the conditions of 90° C., 5 seconds, and 1 MPa. Subsequently, the resultant was thermally cured in an explosion-proof dryer under the conditions of 150° C. and 1 hour, and thereby laminated bodies of Production Examples 4-1 to 4-6 were produced.

Examples 4-1 to 4-6

<Detachability Test>
A xenon lamp was used as a light source for incoherent light. The laminated bodies of Production Examples 4-1 to 4-6 were irradiated with the xenon lamp under the irradiation conditions shown in Table 7, and detachability from the supporting member was evaluated. The temporary fixation material layer was irradiated through the supporting member (slide glass) of the laminated body, using S2300 (wavelength range: 270 nm to near-infrared region, irradiation energy per unit area: 17 J/cm$^2$) manufactured by Xenon Corp. as the xenon lamp. The irradiation distance is the distance between the light source and the stage where the slide glass is installed. Regarding the evaluation of the detachability test, a case in which the silicon wafer was spontaneously detached from the slide glass after irradiation by the xenon lamp was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 7.

TABLE 7

|  |  | Light absorbing layer of laminated body (two conductor layers) | | | | | | | Number of | | |
| --- | --- | --- | --- | --- | --- | --- | --- | --- | --- | --- | --- |
|  |  | First conductor layer | | Second conductor layer | | Applied | Pulse | Irradiation | times of | Irradiation | |
|  | Laminated body | Type | Thickness (nm) | Type | Thickness (nm) | voltage (V) | width (μs) | distance (mm) | irradiation (times) | time (μs) | Evaluation |
| Exam. 4-1a | Production Exam. 4-1 | Ti | 50 | Cu | 200 | 2,800 | 1000 | 10 | 1 | 1000 | B |
| Exam. 4-1b |  |  |  |  |  | 3000 |  |  |  |  | A |

TABLE 7-continued

| Laminated body | Type | Metal | Thickness | Voltage | | | | | Evaluation |
|---|---|---|---|---|---|---|---|---|---|
| Exam. 4-2a | Production Exam. 4-2 | | 100 | 2,800 | | | | | B |
| Exam. 4-2b | Exam. 4-2 | | | 3000 | | | | | A |
| Exam. 4-3a | Production Exam. 4-3 | | 50 | 2,800 | | | | | A |
| Exam. 4-3b | Exam. 4-3 | | | 3000 | | | | | A |
| Exam. 4-4 | Production Exam. 4-4 | Al | 200 | 3000 | | | | | B |
| Exam. 4-5 | Production Exam. 4-5 | Ag | 200 | 3000 | | | | | B |

| Laminated body | Light absorbing layer of laminated body (single conductor layer) | | Applied voltage (V) | Pulse width (μs) | Irradiation distance (mm) | Number of times of irradiation (times) | Irradiation time (μs) | Evaluation |
|---|---|---|---|---|---|---|---|---|
| | Type | Thickness (nm) | | | | | | |
| Exam. 4-6 | Production Exam. 4-6 Cu | 50 | 3000 | 1000 | 10 | 1 | 1000 | B |

It was found that Examples 4-1 to 4-6 were all superior from the viewpoint of detachability from the supporting member.

Examples 5-1 to 5-7

Production Examples 5-1 to 5-7

<Preparation of Curable Resin Component>

70 parts by mass of a hydrogenated styrene-based elastomer (trade name: FG1924, Kraton Polymers Japan, Ltd.) as a thermoplastic resin, 30 parts by mass of a dicyclopentadiene type epoxy resin (trade name: HP-7200H, DIC Corp.) as an epoxy resin, and 2 parts by mass of 1-cyanoethyl-2-phenylimidazole (trade name: CUREZOL 2PZ-CN, Shikoku Chemicals Corp.) as a curing accelerator were mixed. Meanwhile, the hydrogenated styrene-based elastomer was used after being diluted with toluene to a solid content of 25% by mass, and the epoxy resin was used after being diluted with toluene to a solid content of 50% by mass. Mixing was performed using a mix rotor, the mixture was stirred for 24 hours at a rate of 50 rotations/min, and thereby a varnish of the curable resin component including toluene as a solvent was prepared.

<Production of Curable Resin Component Film>

The varnish of the curable resin component thus obtained was applied on a mold release-treated surface of a polyethylene terephthalate (PET) film (PUREX A31, DuPont Teijin Films, Ltd., thickness: 38 μm) using a precision coating machine, the solvent was removed by drying for 10 minutes at 80° C., and thus a curable resin component film (resin layer) having a thickness of about 20 μm was produced.

<Production of Laminated Body (Evaluation Sample)>

A slide glass (size: 20 mm×15 mm, thickness: 1 mm) was prepared as a supporting member, a conductor layer having the metal species and thickness shown in Table 8 was produced by sputtering, and this was used as a light absorbing layer. Meanwhile, this light absorbing layer was subjected to a preliminary treatment by back sputtering (Ar flow rate: 1.2×10$^{-2}$ Pa·m$^3$/s (70 sccm), RF power: 300 W, time: 300 seconds) similarly to Example 2-2, and then RF sputtering was performed under the treatment conditions shown in Table 3. For a light absorbing layer having two conductor layers, a supporting member, a first conductor layer, and a second conductor layer were laminated in this order. Next, the above-mentioned curable resin component film was cut into a size of 50 mm×50 mm, and a silicon wafer (size: 8 mm×10 mm, thickness: 750 μm) was prepared as a semiconductor member. The curable resin component film thus cut was interposed between the light absorbing layer and the slide glass so as to obtain the configuration illustrated in FIG. 5(a), and temporary thermocompression bonding was carried out using a thermocompression bonding machine under the conditions of 90° C., 5 seconds, and 1 MPa. Subsequently, the resultant was thermally cured in an explosion-proof dryer under the conditions of 150° C. and 1 hour, and thereby laminated bodies of Examples 5-1 to 5-7 were produced.

Examples 5-1 to 5-7

<Detachability Test>

A xenon lamp was used as a light source for incoherent light. The laminated bodies of Production Examples 5-1 to 5-7 were irradiated with the xenon lamp under the irradiation conditions shown in Table 8, and detachability from the supporting member was evaluated. The temporary fixation material layer was irradiated through the supporting member (slide glass) of the laminated body, using S2300 (wavelength range: 270 nm to near-infrared region, irradiation energy per unit area: 17 J/cm$^2$) manufactured by Xenon Corp. as the xenon lamp. The irradiation distance is the distance between the light source and the stage where the slide glass is installed. Regarding the evaluation of the detachability test, a case in which the silicon wafer was spontaneously detached from the slide glass after irradiation by the xenon lamp was rated as "A"; a case in which when tweezers were inserted between the silicon wafer and the slide glass, the silicon wafer could be separated without being damaged was rated as "B"; and a case in which the silicon wafer could not be separated was rated as "C". The results are presented in Table 8.

TABLE 8

| | Laminated body | Light absorbing layer of laminated body (two conductor layers) | | | | Applied voltage (V) | Pulse width (μs) | Irradiation distance (mm) | Number of times of irradiation (times) | Irradiation time (μs) | Evaluation |
| | | First conductor layer | | Second conductor layer | | | | | | | |
| | | Type | Thickness (nm) | Type | Thickness (nm) | | | | | | |
|---|---|---|---|---|---|---|---|---|---|---|---|
| Exam. 5-1a | Production Exam. 5-1 | Ti | 50 | Cu | 200 | 4000 or higher | 200 | 50 | 1 | 200 | A |
| Exam. 5-1b | | | | | | 3800 | | | | | B |
| Exam. 5-1c | | | | | | 3700 | | | | | B |
| Exam. 5-2a | Production Exam. 5-2 | | | Al | 200 | 4000 or higher | | | | | A |
| Exam. 5-2b | | | | | | 3800 | | | | | A |
| Exam. 5-2c | | | | | | 3700 | | | | | B |
| Exam. 5-3a | Production Exam. 5-3 | | | Ag | 200 | 4000 or higher | | | | | A |
| Exam. 5-3b | | | | | | 3800 | | | | | B |
| Exam. 5-4a | Production Exam. 5-4 | | | Au | 200 | 4000 or higher | | | | | B |
| Exam. 5-4b | | | | | | 3800 | | | | | B |
| Exam. 5-5a | Production Exam. 5-5 | | | Pt | 200 | 4000 or higher | | | | | B |
| Exam. 5-5b | | | | | | 3800 | | | | | B |

| | Laminated body | Light absorbing layer of laminated body (single conductor layer) | | Applied voltage (V) | Pulse width (μs) | Irradiation distance (mm) | Number of times of irradiation (times) | Irradiation time (μs) | Evaluation |
| | | Type | Thickness (nm) | | | | | | |
|---|---|---|---|---|---|---|---|---|---|
| Exam. 5-6 | Production Exam. 5-6 | Ti | 200 | 4000 or higher | 200 | 50 | 1 | 200 | B |
| Exam. 5-7 | Production Exam. 5-7 | Cu | 200 | 4000 or higher | | | | | B |

It was found that Examples 5-1 to 5-7 were all superior from the viewpoint of detachability from the supporting member.

From the above-described results, it was verified that the semiconductor device manufacturing method of the present invention can easily separate a temporarily fixed semiconductor member from a supporting member.

REFERENCE SIGNS LIST

10: supporting member, 20: temporary fixation material precursor layer, 20c: temporary fixation material layer, 20c': residue of temporary fixation material layer, 22: electroconductive particles, 24: curable resin component, 24c: cured product of curable resin component, 30: temporary fixation material precursor layer, 30c: temporary fixation material layer, 30c': residue of temporary fixation material layer, 32: light absorbing layer, 34: resin layer, 34c: resin cured product layer, 40: semiconductor member, 41: wiring layer, 42: processed semiconductor member, 44: penetration electrode, 50: sealing layer, 60: semiconductor element, 100, 200, 210, 220, 230, 300, 310, 320, 330: laminated body.

The invention claimed is:

1. A semiconductor device manufacturing method, the method comprising:
   a preparation step of preparing a laminated body in which a supporting member, a temporary fixation material layer that generates heat upon absorbing light, and a semiconductor member are laminated in this order; and
   a separation step of irradiating the temporary fixation material layer in the laminated body with incoherent light and thereby separating the semiconductor member from the supporting member,
   wherein the supporting member is a glass substrate.

2. The semiconductor device manufacturing method according to claim 1, wherein a light source for the incoherent light in the separation step is a xenon lamp.

3. The semiconductor device manufacturing method according to claim 1, wherein the incoherent light in the separation step is light including at least infrared light.

4. The semiconductor device manufacturing method according to claim 1, wherein the separation step is a step of irradiating the temporary fixation material layer with the incoherent light through the supporting member.

5. The semiconductor device manufacturing method according to claim 1, wherein the temporary fixation material layer contains a cured product of a curable resin composition including electroconductive particles that generate heat upon absorbing light.

6. The semiconductor device manufacturing method according to claim 5, wherein a content of the electroconductive particles is 30 to 90 parts by mass with respect to a total amount of 100 parts by mass of components other than the electroconductive particles in the curable resin composition.

7. The semiconductor device manufacturing method according to claim 5, wherein the curable resin composition further includes a thermoplastic resin.

8. The semiconductor device manufacturing method according to claim 5, wherein the curable resin composition further includes a polymerizable monomer and a polymerization initiator.

9. The semiconductor device manufacturing method according to claim 1, wherein the temporary fixation material layer has a light absorbing layer that generates heat upon absorbing light.

10. The semiconductor device manufacturing method according to claim 9, wherein the light absorbing layer is formed by sputtering or vacuum vapor deposition.

11. The semiconductor device manufacturing method according to claim 9, wherein the temporary fixation material layer further has a resin cured product layer including a cured product of a curable resin component.

* * * * *